US010211852B2

(12) United States Patent
Mei et al.

(10) Patent No.: US 10,211,852 B2
(45) Date of Patent: Feb. 19, 2019

(54) CRC CALCULATION METHOD, AND APPARATUS

(71) Applicant: Huawei Technologies Co., Ltd., Shenzhen (CN)

(72) Inventors: Fengyin Mei, Beijing (CN); Wenbin Yang, Beijing (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 155 days.

(21) Appl. No.: 15/199,222

(22) Filed: Jun. 30, 2016

(65) Prior Publication Data
US 2016/0315634 A1    Oct. 27, 2016

Related U.S. Application Data

(63) Continuation of application No. PCT/CN2013/091138, filed on Dec. 31, 2013.

(51) Int. Cl.
H03M 13/09 (2006.01)
H03M 13/00 (2006.01)
G06F 11/10 (2006.01)

(52) U.S. Cl.
CPC ......... *H03M 13/09* (2013.01); *G06F 11/1004* (2013.01); *H03M 13/091* (2013.01); *H03M 13/616* (2013.01); *H03M 13/6516* (2013.01)

(58) Field of Classification Search
CPC .. H03M 13/09; H03M 13/091; H03M 13/616; H03M 13/6516; G06F 11/1004
See application file for complete search history.

(56) References Cited

U.S. PATENT DOCUMENTS 7,761,776 B1 * 7/2010 Bataineh ........... H03M 13/6516
                                                    714/758
8,539,326 B1 * 9/2013 Nethercot ............... G06F 11/10
                                                    707/699
(Continued)

FOREIGN PATENT DOCUMENTS

CN          101223700 A          7/2008
CN          101702639 A          5/2010
(Continued)

OTHER PUBLICATIONS

M. E. Kounavis and F. L. Berry, "A systematic approach to building high performance software-based CRC generators," 10th IEEE Symposium on Computers and Communications (ISCC'05), 2005, pp. 855-862.*

(Continued)

Primary Examiner — Cynthia Britt
(74) Attorney, Agent, or Firm — Leydig, Voit & Mayer, Ltd.

(57) ABSTRACT

A CRC calculation method and apparatus are provided. According to technical solutions provided in embodiments of the present invention, a binary sequence of a first pulse includes the first packet and the second packet. The number of bits in the first packet is unequal to the number of bits in the second packet. The first packet is distributed to a first CRC calculation circuit. The second packet is distributed to a second CRC calculation circuit. CRC of the first packet is obtained by calculation by using the first CRC calculation circuit. CRC of the second packet is obtained by using the second CRC calculation circuit. If the foregoing technical solutions are applied to the foregoing application scenario of flexible Ethernet, CRC of packets with different lengths and from different transmitters may be separately calculated.

(Continued)

Therefore, the foregoing technical solutions may be better applied to the scenario of flexible Ethernet.

10 Claims, 8 Drawing Sheets

(56) References Cited

U.S. PATENT DOCUMENTS

| | | | |
|---|---|---|---|
| 8,578,240 B1 | 11/2013 | Pathakota et al. | |
| 2004/0125767 A1 | 7/2004 | Yu et al. | |
| 2007/0016842 A1 | 1/2007 | Samuel et al. | |
| 2008/0075110 A1* | 3/2008 | Fourcand | H04L 12/43 370/458 |
| 2009/0106631 A1* | 4/2009 | Shigihara | H03M 13/091 714/781 |
| 2009/0282148 A1 | 11/2009 | Wong et al. | |
| 2016/0329988 A1* | 11/2016 | Dornstetter | H03M 13/09 |

FOREIGN PATENT DOCUMENTS

| | | |
|---|---|---|
| CN | 102487282 A | 6/2012 |
| CN | 102831789 A | 12/2012 |
| CN | 103401565 A | 11/2013 |

OTHER PUBLICATIONS

Y. Huo, X. Li, W. Wang and D. Liu, "High performance table-based architecture for parallel CRC calculation," The 21st IEEE International Workshop on Local and Metropolitan Area Networks, Beijing, 2015, pp. 1-6.*

IEEE Standard for Ethernet, in IEEE Std 802.3-2012 (Revision to IEEE Std 802.3-2008), vol., No., pp. 1-3747, Dec. 28, 2012.*

Stephen B. Wicker "Error Control Systems for Digital Comunication and Storage" Chapter 5 pp. 99-128, School of Electrical and Computer Engineering Georgia Institute of Technology, Prentice Hall, Upper Saddle River, New Jersey 07458, © 1995.*

Jorge Castiñeira Moreira, Patrick Guy Farrell "Essentials of Error-Control Coding", Published Online: Nov. 6, 2006; Published Print: Jul. 27, 2006; Copyright © 2006 John Wiley & Sons, Ltd.*

Nielson, "Method for High Speed CRC Computation," IBM Technical Disclosure Bulletin, vol. 27, No. 6, pp. 3572-3576, IBM Corporation, Armonk, New York (Nov. 1984).

Zhang et al, "Design and implementation 10-Gigabit Ethernet MAC controller based on FPGA," Computer Engineering and Applications, 2012, 48 (6), (2012).

\* cited by examiner

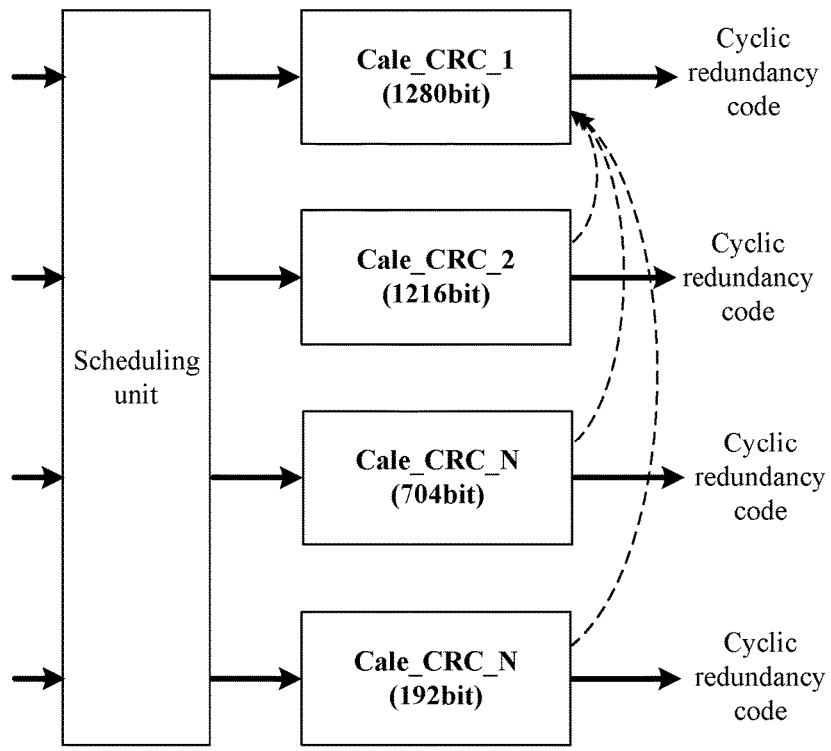

FIG. 2

Receive a binary sequence of a first pulse, where the binary sequence of the first pulse includes a first packet and a second packet, the number of bits of the first packet is M, the number of bits of the second packet is N, M and N are positive integers, and M is unequal to N — S101

Distribute the first packet to a first CRC calculation circuit, where the first CRC calculation circuit calculates CRC of the first packet; and distribute the second packet to a second CRC calculation circuit, where the second CRC calculation circuit calculates CRC of the second packet — S102

FIG. 3

CRC CALCULATION METHOD, AND APPARATUS

CROSS-REFERENCE TO RELATED APPLICATIONS

This application is a continuation of International Application No. PCT/CN2013/091138, filed on Dec. 31, 2013, which is hereby incorporated by reference in its entirety.

TECHNICAL FIELD

Embodiments of the present invention relate to the communications field, and in particular, to a cyclic redundancy code (cyclic redundancy code, CRC for short) calculation method, and an apparatus.

BACKGROUND

Cyclic redundancy check (CRC) is a check method. In a communications system, cyclic redundancy check is a commonly used error check method. Specifically, a source end may calculate CRC of original data according to a generator polynomial. CRC may also be referred to cyclic redundancy check code (CRC). The source end adds the CRC after the original data, and sends, to a sink end, the original data to which the CRC is added. After receiving the original data to which the CRC is added, the sink end may check, according to the CRC and the generator polynomial, whether an error occurs in a process of transmitting the original data.

In the prior art, a CRC calculation circuit corresponding to a packet with a specific length is disposed in a receiver. After receiving the packet with a specific length, the receiver may check, according to the CRC calculation circuit, whether an error occurs in the packet with a specific length. The foregoing technical solution cannot be better applicable to a flexible Ethernet.

SUMMARY

Embodiments of the present invention provide a CRC calculation method, and an apparatus, which may be better applicable to a flexible Ethernet.

According to a first aspect, a cyclic redundancy check code CRC calculation method is provided, and the method includes:

receiving a binary sequence of a first pulse, where the binary sequence of the first pulse includes a first packet and a second packet, the number of bits in the first packet is M, the number of bits in the second packet is N, M and N are positive integers, and M is unequal to N;

distributing the first packet to a first CRC calculation circuit, where the first CRC calculation circuit calculates CRC of the first packet; and distributing the second packet to a second CRC calculation circuit, where the second CRC calculation circuit calculates CRC of the second packet.

With reference to the first aspect, in a first possible implementation manner, the binary sequence of the first pulse further includes a third packet, and the number of bits in the third packet is X; and the method further includes:

generating a first binary sequence according to the third packet, where the number of bits in the first binary sequence is Y, a value of high order X bits in the first binary sequence is equal to a value of the bits in the third packet, a value of low order C bits in the first binary sequence is equal to 0, Y=X+C, and Y, X, and C are positive integers; and distributing the first binary sequence to a third CRC calculation circuit, where the third CRC calculation circuit calculates CRC of the first binary sequence.

With reference to the first aspect or the first possible implementation manner of the first aspect, in a second possible implementation manner, the binary sequence of the first pulse further includes high order A bits in a fourth packet, and the number of bits in the fourth packet is A+B; and the method further includes:

generating a second binary sequence according to the high order A bits in the fourth packet, where the number of bits in the second binary sequence is a value of high order A bits in the second binary sequence is equal to a value of the high order A bits in the fourth packet, a value of low order H bits in the second binary sequence is equal to 0, G=A+H, A, B, and G are positive integers, H is an integer greater than or equal to 0, and B is less than or equal to G;

distributing the second binary sequence to a fourth CRC calculation circuit, where the fourth CRC calculation circuit calculates CRC of the second binary sequence to initialize a value of a CRC register of the fourth CRC calculation circuit;

receiving a binary sequence of a second pulse, where the second pulse is a pulse following the first pulse, and the binary sequence of the second pulse includes low order B bits in the fourth packet; and distributing the low order B bits in the fourth packet to the fourth CRC calculation circuit, where the fourth CRC calculation circuit calculates CRC of the low order B bits in the fourth packet by using the CRC of the second binary sequence as an initial value of the CRC register of the fourth CRC calculation circuit.

With reference to the first aspect or the first possible implementation manner of the first aspect, in a third possible implementation manner, the binary sequence of the first pulse further includes high order A bits in a fourth packet, and the number of bits in the fourth packet is A+B; and the method further includes:

generating a second binary sequence according to the high order A bits in the fourth packet, where the number of bits in the second binary sequence is a value of high order A bits in the second binary sequence is equal to a value of the high order A bits in the fourth packet, a value of low order H bits in the second binary sequence is equal to 0, G=A+H, A, B, and G are positive integers, and H is an integer greater than or equal to 0;

distributing the second binary sequence to a fourth CRC calculation circuit, where the fourth CRC calculation circuit calculates CRC of the second binary sequence;

receiving a binary sequence of a second pulse, where the second pulse is a pulse following the first pulse, and the binary sequence of the second pulse includes low order B bits in the fourth packet; and distributing the low order B bits in the fourth packet to a fifth CRC calculation circuit, where the fifth CRC calculation circuit calculates CRC of the low order B bits in the fourth packet by using the CRC of the second binary sequence as an initial value of a CRC register of the fifth CRC calculation circuit.

With reference to the first aspect or any one possible implementation manner of the first to third possible implementation manners of the first aspect, in a fourth possible implementation manner, the first CRC calculation circuit includes a first data exclusive OR calculation circuit, and the first data exclusive OR calculation circuit is expressed as:

$$CRC\_D_n = [\,P \quad H*P \quad L \quad H^{n-1}*P\,] * \begin{bmatrix} d_{n-1} \\ d_{n-2} \\ M \\ d_0 \end{bmatrix},$$

where $d_0$ to $d_{n-1}$ in $$\begin{bmatrix} d_{n-1} \\ d_{n-2} \\ M \\ d_0 \end{bmatrix}$$

are respectively a least significant bit to a most significant bit of the binary sequence having the M bits, and a value of n is M; and $$P = \begin{bmatrix} p_{m-1} \\ M \\ p_1 \\ p_0 \end{bmatrix}$$

is a generator polynomial matrix, $p_{m-1}$ to $p_0$ are CRC polynomial coefficients of the first CRC calculation circuit, m is a degree of a generator polynomial, and $$H = \begin{bmatrix} p_{m-1} & 1 & 0 & L & 0 & 0 \\ p_{m-2} & 0 & 1 & & & 0 \\ p_{m-3} & & & O & & 0 \\ M & & & & 1 & M \\ p_1 & 0 & 0 & L & 0 & 1 \\ p_0 & 0 & 0 & 0 & 0 & 0 \end{bmatrix}_{m*m}$$

is a transformation matrix; and the second CRC calculation circuit includes a second data exclusive OR calculation circuit, and the second data exclusive OR calculation circuit is expressed as:

$$CRC\_D_n = [\,P \quad H*P \quad L \quad H^{n-1}*P\,] * \begin{bmatrix} d_{n-1} \\ d_{n-2} \\ M \\ d_0 \end{bmatrix},$$

where $d_0$ to $d_{n-1}$ in $$\begin{bmatrix} d_{n-1} \\ d_{n-2} \\ M \\ d_0 \end{bmatrix}$$

are respectively a least significant bit to a most significant bit of the binary sequence having the M bits, and a value of n is N; and $$P = \begin{bmatrix} p_{m-1} \\ M \\ p_1 \\ p_0 \end{bmatrix}$$

is a generator polynomial entry matrix, $p_{m-1}$ to $p_0$ are CRC polynomial coefficients of the first CRC calculation circuit, m is a degree of a generator polynomial, and $$H = \begin{bmatrix} p_{m-1} & 1 & 0 & L & 0 & 0 \\ p_{m-2} & 0 & 1 & & & 0 \\ p_{m-3} & & & O & & 0 \\ M & & & & 1 & M \\ p_1 & 0 & 0 & L & 0 & 1 \\ p_0 & 0 & 0 & 0 & 0 & 0 \end{bmatrix}_{m*m}$$

is a transformation matrix.

According to a second aspect, a cyclic redundancy check code CRC calculation apparatus is provided, and the apparatus includes:

a receiving unit, configured to receive a binary sequence of a first pulse, where the binary sequence of the first pulse includes a first packet and a second packet, the number of bits in the first packet is M, the number of bits in the second packet is N, M and N are positive integers, and M is unequal to N;

a scheduling unit, configured to distribute the first packet received by the receiving unit to a first CRC calculation circuit, and distribute the second packet received by the receiving unit to a second CRC calculation circuit;

the first CRC calculation circuit, configured to calculate CRC of the first packet distributed by the scheduling unit; and the second CRC calculation circuit, configured to calculate CRC of the second packet distributed by the scheduling unit.

With reference to the second aspect, in a first possible implementation manner, the apparatus further includes a third CRC calculation circuit, the binary sequence of the first pulse further includes a third packet, and the number of bits in the third packet is X;

the scheduling unit is further configured to:

generate a first binary sequence according to the third packet received by the receiving unit, where the number of bits in the first binary sequence is Y, a value of high order X bits in the first binary sequence is equal to a value of the bits in the third packet, a value of low order C bits in the first binary sequence is equal to 0, Y=X+C, and Y, X, and C are positive integers; and distribute the first binary sequence to the third CRC calculation circuit; and the third CRC calculation circuit is configured to calculate CRC of the first binary sequence distributed by the scheduling unit.

With reference to the second aspect or the first possible implementation manner of the second aspect, in a second possible implementation manner, the apparatus further includes a fourth CRC calculation circuit, the binary sequence of the first pulse further includes high order A bits in a fourth packet, and the number of bits in the fourth packet is A+B;

the scheduling unit is further configured to:

generate a second binary sequence according to the high order A bits in the fourth packet, where the number of bits in the second binary sequence is a value of high order A bits in the second binary sequence is equal to a value of the high order A bits in the fourth packet, a value of low order H bits in the second binary sequence is equal to 0, G=A+H, A, B, and G are positive integers, H is an integer greater than or equal to 0, and B is less than or equal to G; and distribute the second binary sequence to the fourth CRC calculation circuit;

the fourth CRC calculation circuit is configured to calculate CRC of the second binary sequence to initialize a value of a CRC register of the fourth CRC calculation circuit;

the receiving unit is further configured to receive a binary sequence of a second pulse, where the second pulse is a pulse following the first pulse, and the binary sequence of the second pulse includes low order B bits in the fourth packet;

the scheduling unit is further configured to distribute the low order B bits in the fourth packet to the fourth CRC calculation circuit; and the fourth CRC calculation circuit is further configured to calculate CRC of the low order B bits in the fourth packet by using the CRC of the second binary sequence as an initial value of the CRC register of the fourth CRC calculation circuit.

With reference to the second aspect or the first possible implementation manner of the second aspect, in a third possible implementation manner, the apparatus further includes a fourth CRC calculation circuit and a fifth CRC calculation circuit, the binary sequence of the first pulse further includes high order A bits in a fourth packet, and the number of bits in the fourth packet is A+B;

the scheduling unit is further configured to:

generate a second binary sequence according to the high order A bits in the fourth packet, where the number of bits in the second binary sequence is a value of high order A bits in the second binary sequence is equal to a value of the high order A bits in the fourth packet, a value of low order H bits in the second binary sequence is equal to 0, G=A+H, A, B, and G are positive integers, and H is an integer greater than or equal to 0; and distribute the second binary sequence to the fourth CRC calculation circuit;

the fourth CRC calculation circuit is configured to calculate CRC of the second binary sequence according to the second binary sequence distributed by the scheduling unit;

the receiving unit is further configured to receive a binary sequence of a second pulse, where the second pulse is a pulse following the first pulse, and the binary sequence of the second pulse includes low order B bits in the fourth packet;

the scheduling unit is further configured to distribute the low order B bits in the fourth packet to the fifth CRC calculation circuit; and the fifth CRC calculation circuit is configured to calculate CRC of the low order B bits in the fourth packet by using the CRC of the second binary sequence as an initial value of a CRC register of the fifth CRC calculation circuit.

With reference to the second aspect or any one possible implementation manner of the first to third possible implementation manners of the second aspect, in a fourth possible implementation manner, the first CRC calculation circuit includes a first data exclusive OR calculation circuit, and the first data exclusive OR calculation circuit is expressed as:

$$\text{CRC\_D}_n = [P \quad H*P \quad L \quad H^{n-1}*P] * \begin{bmatrix} d_{n-1} \\ d_{n-2} \\ M \\ d_0 \end{bmatrix},$$

where $d_0$ to $d_{n-1}$ in $$\begin{bmatrix} d_{n-1} \\ d_{n-2} \\ M \\ d_0 \end{bmatrix}$$

are respectively a least significant bit to a most significant bit of the binary sequence having the M bits, and a value of n is M; and $$P = \begin{bmatrix} p_{m-1} \\ M \\ p_1 \\ p_0 \end{bmatrix}$$

is a generator polynomial matrix, $p_{m-1}$ to $p_0$ are CRC polynomial coefficients of the first CRC calculation circuit, m is a degree of a generator polynomial, and $$H = \begin{bmatrix} p_{m-1} & 1 & 0 & L & 0 & 0 \\ p_{m-2} & 0 & 1 & & & 0 \\ p_{m-3} & & & O & & 0 \\ M & & & & 1 & M \\ p_1 & 0 & 0 & L & 0 & 1 \\ p_0 & 0 & 0 & 0 & 0 & 0 \end{bmatrix}_{m*m}$$

is a transformation matrix; and the second CRC calculation circuit includes a second data exclusive OR calculation circuit, and the second data exclusive OR calculation circuit is expressed as:

$$\text{CRC\_D}_n = [P \quad H*P \quad L \quad H^{n-1}*P] * \begin{bmatrix} d_{n-1} \\ d_{n-2} \\ M \\ d_0 \end{bmatrix},$$

where $d_0$ to $d_{n-1}$ in $$\begin{bmatrix} d_{n-1} \\ d_{n-2} \\ M \\ d_0 \end{bmatrix}$$

are respectively a least significant bit to a most significant bit of the binary sequence having the M bits, and a value of n is N; and $$P = \begin{bmatrix} p_{m-1} \\ M \\ p_1 \\ p_0 \end{bmatrix}$$

is a generator polynomial entry matrix, $p_{m-1}$ to $p_0$ are CRC polynomial coefficients of the first CRC calculation circuit, m is a degree of a generator polynomial, and $$H = \begin{bmatrix} p_{m-1} & 1 & 0 & L & 0 & 0 \\ p_{m-2} & 0 & 1 & & & 0 \\ p_{m-3} & & & O & & 0 \\ M & & & & 1 & M \\ p_1 & 0 & 0 & L & 0 & 1 \\ p_0 & 0 & 0 & 0 & 0 & 0 \end{bmatrix}_{m*m}$$

is a transformation matrix.

According to a third aspect, a system chip 500 is provided, the system chip 500 may be configured to execute the foregoing first aspect or any one possible implementation manner of the first to fourth possible implementation manners of the first aspect. The system chip 500 includes a PHY 510 and a MAC 520, where the MAC 520 includes an RS 521, a dispatcher 522, and a CRC calculation circuit 523 to a CRC calculation circuit 527; the PHY 510 is connected to the MAC 520 by using an MII; the RS 521 is coupled with the dispatcher 522; the dispatcher 522 is coupled with the CRC calculation circuit 523 to the CRC calculation circuit 527; and the MAC 520 may work under driving of a clock apparatus, and specifically, the RS 521, the dispatcher 522, and the CRC calculation circuit 523 to the CRC calculation circuit 527 work under driving of the clock apparatus, where the RS 521 sends a binary sequence of a first clock cycle to the dispatcher 522 in the first clock cycle under driving of the clock apparatus, where the binary sequence of the first clock cycle includes a first packet and a second packet, the number of bits in the first packet is M, the number of bits in the second packet is N, M and N are positive integers, M is unequal to N, the first packet is an Ethernet frame, and the second packet is an Ethernet frame;

the dispatcher 522 receives the binary sequence of the first clock cycle under driving of the clock apparatus;

the dispatcher 522 distributes the first packet to a first CRC calculation circuit, where the first CRC calculation circuit calculates CRC of the first packet, and the CRC calculation circuit 523 is the first CRC calculation circuit; and the dispatcher 522 distributes the second packet to a second CRC calculation circuit, where the second CRC calculation circuit calculates CRC of the second packet, and the CRC calculation circuit 524 is the second CRC calculation circuit.

With reference to the third aspect, in a first possible implementation manner, the binary sequence of the first clock cycle further includes a third packet, where the number of bits in the third packet is X;

the dispatcher 522 generates a first binary sequence according to the third packet, where the number of bits in the first binary sequence is Y, a value of high order X bits in the first binary sequence is equal to a value of the bits in the third packet, a value of low order C bits in the first binary sequence is equal to 0, Y=X+C, and Y, X, and C are positive integers; and the dispatcher 522 distributes the first binary sequence to a third CRC calculation circuit, where the third CRC calculation circuit calculates CRC of the first binary sequence, and the CRC calculation circuit 525 is the third CRC calculation circuit.

With reference to the third aspect or the first possible implementation manner of the third aspect, in a second possible implementation manner, the binary sequence of the first clock cycle further includes high order A bits in a fourth packet, where the number of bits in the fourth packet is A+B, and the fourth packet is an Ethernet frame;

the dispatcher 522 generates a second binary sequence according to the high order A bits in the fourth packet, where the number of bits in the second binary sequence is a value of high order A bits in the second binary sequence is equal to a value of the high order A bits in the fourth packet, a value of low order H bits in the second binary sequence is equal to 0, G=A+H, A, B, and G are positive integers, H is an integer greater than or equal to 0, and B is less than or equal to G;

the dispatcher 522 distributes the second binary sequence to a fourth CRC calculation circuit, where the fourth CRC calculation circuit calculates CRC of the second binary sequence to initialize a value of a CRC register of the fourth CRC calculation circuit;

the dispatcher 522 receives a binary sequence that is sent in a second clock cycle by the RS 521 under driving of the clock apparatus, where the second clock cycle is a clock cycle following the first clock cycle, and the binary sequence of the second clock cycle includes low order B bits in the fourth packet;

the dispatcher 522 distributes the low order B bits in the fourth packet to the fourth CRC calculation circuit, and the CRC calculation circuit 526 is the fourth CRC calculation circuit; and the fourth CRC calculation circuit calculates CRC of the low order B bits in the fourth packet by using the CRC of the second binary sequence as an initial value of the CRC register of the fourth CRC calculation circuit.

With reference to the third aspect or the first possible implementation manner of the third aspect, in a third possible implementation manner, the binary sequence of the first clock cycle further includes high order A bits in a fourth packet, where the number of bits in the fourth packet is A+B;

the dispatcher 522 generates a second binary sequence according to the high order A bits in the fourth packet, where the number of bits in the second binary sequence is a value of high order A bits in the second binary sequence is equal to a value of the high order A bits in the fourth packet, a value of low order H bits in the second binary sequence is equal to 0, G=A+H, A, B, and G are positive integers, and H is an integer greater than or equal to 0;

the dispatcher 522 distributes the second binary sequence to a fourth CRC calculation circuit, where the fourth CRC calculation circuit calculates CRC of the second binary sequence, and the CRC calculation circuit 526 is the fourth CRC calculation circuit;

the dispatcher 522 receives a binary sequence that is sent in a second clock cycle by the RS 521 under driving of the clock apparatus, where the second clock cycle is a clock cycle following the first clock cycle, and the binary sequence of the second clock cycle includes low order B bits in the fourth packet; and the dispatcher 522 distributes the low order B bits in the fourth packet to a fifth CRC calculation circuit, where the fifth CRC calculation circuit calculates CRC of the low order B bits in the fourth packet by using the CRC of the second binary sequence as an initial value of a CRC register of the fifth CRC calculation circuit, and the CRC calculation circuit 527 is the fifth CRC calculation circuit.

With reference to the third aspect or any one possible implementation manner of the first to third possible implementation manners of the third aspect, in a fourth possible implementation manner, the first CRC calculation circuit includes a first data exclusive OR calculation circuit, and the first data exclusive OR calculation circuit is expressed as:

$$\text{CRC\_D}_n = [\, P \quad H*P \quad L \quad H^{n-1}*P \,] * \begin{bmatrix} d_{n-1} \\ d_{n-2} \\ M \\ d_0 \end{bmatrix},$$

where $d_0$ to $d_{n-1}$ in $$\begin{bmatrix} d_{n-1} \\ d_{n-2} \\ M \\ d_0 \end{bmatrix}$$

are respectively a least significant bit to a most significant bit of the binary sequence having the M bits, and a value of n is M; and $$P = \begin{bmatrix} p_{m-1} \\ M \\ p_1 \\ p_0 \end{bmatrix}$$

is a generator polynomial matrix, $p_{m-1}$ to $p_0$ are CRC polynomial coefficients of the first CRC calculation circuit, m is a degree of a generator polynomial, and $$H = \begin{bmatrix} p_{m-1} & 1 & 0 & L & 0 & 0 \\ p_{m-2} & 0 & 1 & & & 0 \\ p_{m-3} & & & O & & 0 \\ M & & & & 1 & M \\ p_1 & 0 & 0 & L & 0 & 1 \\ p_0 & 0 & 0 & 0 & 0 & 0 \end{bmatrix}_{m*m}$$

is a transformation matrix; and optionally, the second CRC calculation circuit includes a second data exclusive OR calculation circuit, and the second data exclusive OR calculation circuit is expressed as:

$$\text{CRC\_D}_n = [\, P \quad H*P \quad L \quad H^{n-1}*P \,] * \begin{bmatrix} d_{n-1} \\ d_{n-2} \\ M \\ d_0 \end{bmatrix},$$

where $d_0$ to $d_{n-1}$ in $$\begin{bmatrix} d_{n-1} \\ d_{n-2} \\ M \\ d_0 \end{bmatrix}$$

are respectively a least significant bit to a most significant bit of the binary sequence having the M bits, and a value of n is N; and $$P = \begin{bmatrix} p_{m-1} \\ M \\ p_1 \\ p_0 \end{bmatrix}$$

is a generator polynomial entry matrix, $p_{m-1}$ to $p_0$ are CRC polynomial coefficients of the first CRC calculation circuit, m is a degree of a generator polynomial, and $$H = \begin{bmatrix} p_{m-1} & 1 & 0 & L & 0 & 0 \\ p_{m-2} & 0 & 1 & & & 0 \\ p_{m-3} & & & O & & 0 \\ M & & & & 1 & M \\ p_1 & 0 & 0 & L & 0 & 1 \\ p_0 & 0 & 0 & 0 & 0 & 0 \end{bmatrix}_{m*m}$$

is a transformation matrix.

The CRC calculation solutions provided in the embodiments of the present invention are more easily applied to a scenario of bandwidth-flexible Ethernet. There may be the following application scenario for flexible Ethernet: one receiver needs to receive, by using an Ethernet interface of the receiver, packets separately sent by a plurality of transmitters by using a plurality of Ethernet interfaces. Each transmitter includes one Ethernet interface. The plurality of transmitters is in a one-to-one correspondence with the plurality of Ethernet interfaces. For the plurality of transmitters, lengths of packets sent by different transmitters may be different.

According to the foregoing technical solutions, a binary sequence of a first pulse includes a first packet and a second packet. The number of bits in the first packet is unequal to the number of bits in the second packets. The first packet is distributed to a first CRC calculation circuit. The second packet is distributed to a second CRC calculation circuit. CRC of the first packet is obtained by calculation by using the first CRC calculation circuit. CRC of the second packet is obtained by using the second CRC calculation circuit. If the foregoing technical solutions are applied to the foregoing application scenario of the flexible Ethernet, CRC of packets with different lengths and from different transmitters may be separately calculated. Therefore, the foregoing technical solutions may be better applied to a scenario of flexible Ethernet.

BRIEF DESCRIPTION OF DRAWINGS

To describe the technical solutions in the embodiments of the present invention more clearly, the following briefly introduces the accompanying drawings required for describing the embodiments. Apparently, the accompanying drawings in the following description show merely some embodiments of the present invention, and a person of ordinary skill in the art may still derive other drawings from these accompanying drawings without creative efforts.

FIG. 2 is a schematic diagram of application of a CRC calculation structure to 400GE Ethernet according to an embodiment of the present invention;

FIG. 3 is a schematic flowchart of a CRC calculation method according to an embodiment of the present invention;

DESCRIPTION OF EMBODIMENTS

Figure 1:
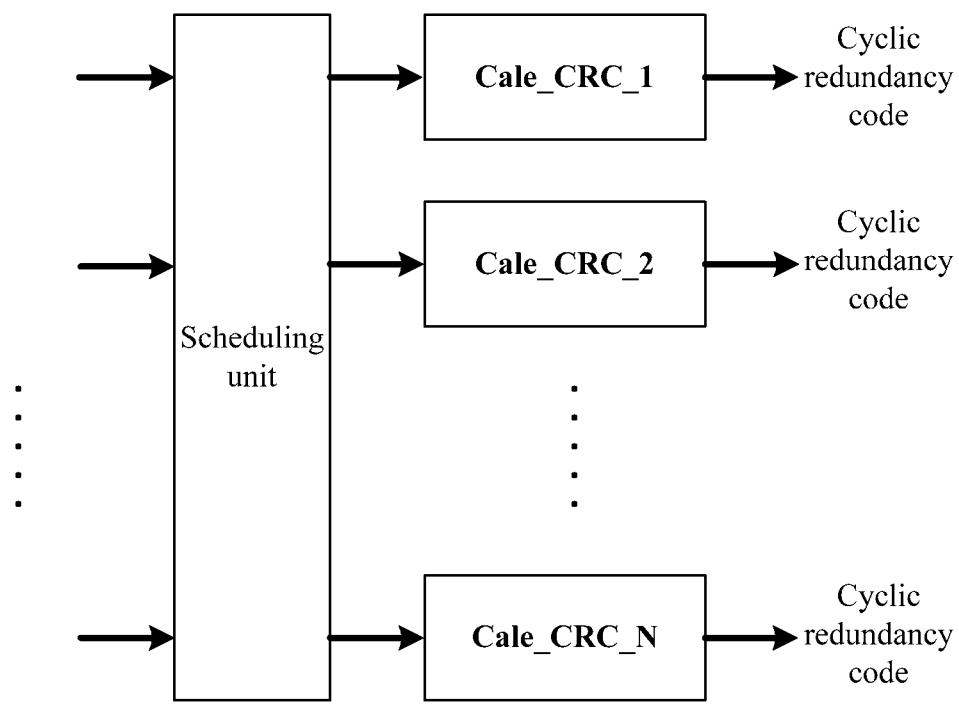
FIG. 1 is a schematic diagram of a CRC calculation solution according to an embodiment of the present invention.

To make the objectives, technical solutions, and advantages of the present invention clearer, the following further describes the present invention in detail with reference to the accompanying drawings. Apparently, the described embodiments are merely a part rather than all of the embodiments of the present invention. All other embodiments obtained by a person of ordinary skill in the art based on the embodiments of the present invention without creative efforts shall fall within the protection scope of the present invention.

The following describes some terms involved in the embodiments of the present invention:

Physical layer circuit (physical layer, PHY for short): The PHY may be implemented by using a field programmable gate array (field programmable gate array, FPGA for short) or an application specific integrated circuit (application specific integrated circuit, ASIC for short). The PHY may be a component of a network interface card (network interface card, NIC for short), where the NIC may be a line card (line card, LC for short) or a physical interface card (physical interface card, PIC for short). The PHY may be connected to a media access controller (media access controller, MAC for short) by using a media independent interface (Media Independence Interface, MII for short).

PHY chip (PHY chip): The PHY chip may include one PHY or a plurality of PHYs. The PHY chip may be implemented by using an FPGA or an ASIC.

MAC: The MAC may be implemented by using an FPGA or an ASIC. The MAC may include a reconciliation sublayer circuit (reconciliation sublayer, RS for short), a dispatcher (dispatcher), and at least one CRC calculation circuit. The RS is coupled with the dispatcher. The dispatcher is coupled with the at least one CRC calculation circuit. The dispatcher may be configured to receive a binary sequence output by the RS, where the binary sequence includes at least one Ethernet frame (ethernet frame). The dispatcher may be configured to distribute the at least one Ethernet frame to the at least one CRC calculation circuit. The MAC may work under driving of a clock apparatus. A component of the MAC (for example, the RS, the dispatcher, or the at least one CRC calculation circuit) also works under driving of the clock apparatus.

MAC chip (MAC chip): The MAC chip may include one MAC or a plurality of MACs. The MAC chip may be implemented by using an FPGA or an ASIC.

System chip: The system chip may include one MAC and one PHY. The system chip may also include a plurality of MACs and a plurality of PHYs. The PHY of the system chip may be coupled with the MAC of the system chip. The system chip may be implemented by using an FPGA or an ASIC.

CRC calculation circuit (cyclic redundancy code calculating circuit): is a circuit configured to calculate CRC of data. Specifically, the CRC calculation circuit may calculate the CRC of the data according to a generator polynomial (generator polynomial). The data may be a binary sequence (binary sequence). The binary sequence may be a packet. The CRC calculation circuit may include a CRC register. In the technical solutions provided in the embodiments of the present invention, when calculating CRC of data, a CRC calculation circuit may serially calculate the CRC of the data, or may concurrently calculate the CRC of the data. In the technical solutions provided in the embodiments of the present invention, each CRC calculation circuit may be corresponding to a same generator polynomial.

Receiver: The receiver may include an Ethernet interface. The Ethernet interface may include a serializer/deserializer (serializer/deserializer, serdes for short), a PHY, and a MAC. The serdes is coupled with the PHY. The PHY is coupled with the MAC.

Multiport Ethernet device: The multiport Ethernet device may be an Ethernet hub, an Ethernet router, or an Ethernet switch. The multiport Ethernet device includes a plurality of ports, where each port may include a receiver. The receiver may include a system chip. The system chip may include a MAC and a PHY.

A value of bits in a binary sequence: A value of a binary number (binary number) corresponding to the binary sequence. The value of the binary number may be expressed by using a decimal number. For example, a binary number corresponding to a binary sequence 1010 is 1010. A value of the binary number 1010 is 10 (a decimal number). A binary number corresponding to high order 2 bits in the binary sequence 1010 is 10. A value of the high order 2 bits in the binary sequence 1010 is equal to 2 (a decimal number). A binary number corresponding to low order 2 bits in the binary sequence 1010 is also 10. A value of the low order 2 bits in the binary sequence 1010 is equal to 2 (a decimal number).

The CRC calculation solutions provided in the embodiments of the present invention are more easily applied to a scenario of bandwidth-flexible Ethernet. Specifically, in a scenario of flexible Ethernet, lengths of different packets may be different. For the application scenario in which a length of a packet is variable, an embodiment of the present invention provides a CRC calculation method.

FIG. 3 is a schematic flowchart of a CRC calculation method according to an embodiment of the present invention. The method may be executed by a MAC, a MAC chip, a system chip, a receiver, or a multiport Ethernet device. Refer to FIG. 3. The method includes:

S101: Receive a binary sequence of a first pulse, where the binary sequence of the first pulse includes a first packet and a second packet, the number of bits in the first packet is M, the number of bits in the second packet is N, M and N are positive integers, and M is unequal to N.

For example, S101 may be executed by a dispatcher of a MAC. The binary sequence of the first pulse may be output by an RS of the MAC.

For example, the first packet is an Ethernet frame. The second packet is an Ethernet frame. The first pulse is corresponding to one clock cycle of a clock apparatus. The clock apparatus is configured to drive an execution body of the method shown in FIG. 3 to receive the binary sequence of the first pulse.

For example, the first packet may be a packet sent by a first transmitter. The second packet may be a packet sent by a second transmitter. Specifically, the first transmitter sends the first packet by using a first Ethernet interface. The second transmitter sends the second packet by using a second Ethernet interface. A type of the first Ethernet interface may be different from a type of the second Ethernet interface. For example, the first Ethernet interface may be a 40 gigabit Ethernet (40 gigabit ethernet, 40GE for short) interface. The second Ethernet interface may be a 100 gigabit Ethernet (100 gigabit ethernet, 100GE for short) interface. The first transmitter may be a transmitter of a first network apparatus. The second transmitter may be a transmitter of a second network apparatus. The first network apparatus and the second network apparatus may be different network apparatuses.

The "first pulse" herein may be any pulse. The number of bits in a binary sequence received by the receiver in each pulse may be the same. For example, the number of bits in a binary sequence received in each pulse is 1280.

In a scenario of flexible Ethernet, lengths of different packets may be different, that is, different packets may be different in the number of bits in a binary sequence. A minimum length of a packet may be stipulated for a communications system. For example, it may be stipulated that one packet includes at least 512 bits for the communications system.

A binary sequence of a pulse may include one or more packets, and the numbers of bits in a binary sequence in all packets may be the same or may be different. In a scenario of the procedure, the binary sequence of the first pulse includes the first packet and the second packet, and the first packet and the second packet are different in the number of bits in the binary sequence.

S102: Distribute the first packet to a first CRC calculation circuit, where the first CRC calculation circuit calculates CRC of the first packet; and distribute the second packet to a second CRC calculation circuit, where the second CRC calculation circuit calculates CRC of the second packet.

For example, S102 may be executed by the dispatcher.

The maximum number of packets that may be received in one pulse may be determined according to the number of bits in a binary sequence received in the one pulse and a minimum length of a packet (that is, a minimum value of the number of bits in the binary sequence of the packet) stipulated for a communications system. The number of CRC calculation circuits may be determined according to the maximum number of packets that may be received in one pulse. For example, the maximum number of packets received in one pulse is recorded as:

$$N = \left\lceil \frac{P_{len}}{l} \right\rceil + 1$$

where $P_{len}$ is the number of bits in a binary sequence received in one pulse; l is a minimum value of the number of bits in a binary sequence of a packet; and $\lceil \bullet \rceil$ indicates rounding up to an integer, that is, a minimum integer greater than or equal to $$\frac{P_{len}}{l}$$

is obtained.

In this case, the number of CRC calculation circuits may be N calculated by using the foregoing expression.

Each CRC calculation circuit is configured, so as to concurrently calculate CRC of a binary sequence having specific bits. For example, each CRC calculation circuit may be configured, so as to concurrently calculate CRC of a binary sequence having N bits, where a value of N may be the same as the number of bits in a binary sequence received in one pulse.

For example, in this embodiment of the present invention, the first CRC calculation circuit is configured, so as to concurrently calculate CRC of a binary sequence having M bits, and the second CRC calculation circuit is configured, so as to concurrently calculate CRC of a binary sequence having N bits.

There may be the following application scenario for flexible Ethernet: one receiver needs to receive, by using an Ethernet interface of the receiver, packets separately sent by a plurality of transmitters by using a plurality of Ethernet interfaces. Each transmitter includes one Ethernet interface. The plurality of transmitters is in a one-to-one correspondence with the plurality of Ethernet interfaces. For the plurality of transmitters, lengths of packets sent by different transmitters may be different.

According to the foregoing technical solution, a binary sequence of a first pulse includes a first packet and a second packet. The number of bits in the first packet is unequal to the number of bits in the second packet. The first packet is distributed to a first CRC calculation circuit. The second packet is distributed to a second CRC calculation circuit. CRC of the first packet is obtained by calculation by using the first CRC calculation circuit. CRC of the second packet is obtained by using the second CRC calculation circuit. If the foregoing technical solution is applied to the foregoing application scenario of the flexible Ethernet, CRC of packets with different lengths and from different transmitters may be separately calculated. Therefore, the foregoing technical solution may be better applied to a scenario of flexible Ethernet.

Optionally, in the technical solution shown in FIG. 3, the binary sequence of the first pulse may further include a third packet, where the number of bits in the third packet is X.

Specifically, the technical solution shown in FIG. 3 may further involve a third CRC calculation circuit. The third CRC calculation circuit is configured, so as to concurrently calculate CRC of a binary sequence having Y (Y>X) bits. In the scenario, the following processing may be performed on the third packet:

A first binary sequence is generated according to the third packet, where the number of bits in the first binary sequence is Y; and a value of high order X bits in the first binary sequence is equal to a value of the bits in the third packet. A value of low order C bits in the first binary sequence is equal to 0. Y=X+C. Y, X, and C are positive integers.

Optionally, a shift operation may be executed on the third packet to obtain the first binary sequence.

The first binary sequence is distributed to the third CRC calculation circuit, where the third CRC calculation circuit calculates CRC of the first binary sequence.

For example, Y may be unequal to M. Y may be unequal to N.

Optionally, in the technical solution shown in FIG. 3, the binary sequence of the first pulse may further include high order A bits in a fourth packet, where the number of bits in the fourth packet is A+B.

For example, a sum of A and B is unequal to M, and a sum of A and B is unequal to N.

Specifically, the technical solution shown in FIG. 3 may further involve a fourth CRC calculation circuit. The fourth CRC calculation circuit is configured, so as to calculate CRC of a binary sequence having G bits. In this scenario, for the fourth packet, the following two manners may be used for performing processing:

Manner 1

A second binary sequence is generated according to the high order A bits in the fourth packet, where the number of bits in the second binary sequence is a value of high order A bits in the second binary sequence is equal to a value of the high order A bits in the fourth packet, a value of low order H bits in the second binary sequence is equal to 0, G=A+H, A, B, and G are positive integers, H is an integer greater than or equal to 0, and B is less than or equal to G.

Optionally, when H is a positive integer, a shift operation may be executed on the high order A bits in the fourth packet to obtain the second binary sequence, and when H is 0, the second binary sequence is equal to the high order A bits in the fourth packet.

The second binary sequence is distributed to the fourth CRC calculation circuit, where the fourth CRC calculation circuit calculates CRC of the second binary sequence to initialize a value of a CRC register of the fourth CRC calculation circuit.

A binary sequence of a second pulse (the second pulse is a pulse following the first pulse) is received, where the binary sequence of the second pulse includes low order B bits in the fourth packet.

The low order B bits in the fourth packet are distributed to the fourth CRC calculation circuit, where the fourth CRC calculation circuit calculates CRC of the low order B bits in the fourth packet by using the CRC of the second binary sequence as an initial value of the CRC register of the fourth CRC calculation circuit.

Manner 2

A second binary sequence is generated according to the high order A bits in the fourth packet, where the number of bits in the second binary sequence is a value of high order A bits in the second binary sequence is equal to a value of the high order A bits in the fourth packet, a value of low order H bits in the second binary sequence is equal to 0, G=A+H, A, B, and G are positive integers, and H is an integer greater than or equal to 0.

Optionally, when H is a positive integer, a shift operation may be executed on the high order A bits in the fourth packet to obtain the second binary sequence, and when H is 0, the second binary sequence is equal to the high order A bits in the fourth packet.

The second binary sequence is distributed to the fourth CRC calculation circuit, where the fourth CRC calculation circuit calculates CRC of the second binary sequence.

A binary sequence of a second pulse is received, where the second pulse is a pulse following the first pulse, and the binary sequence of the second pulse includes low order B bits in the fourth packet.

The low order B bits in the fourth packet are distributed to a fifth CRC calculation circuit, and specifically, a CRC register of the fourth CRC calculation circuit transfers information to a CRC register of the fifth CRC calculation circuit.

The fifth CRC calculation circuit calculates CRC of the low order B bits in the fourth packet by using the CRC of the second binary sequence as an initial value of the CRC register of the fifth CRC calculation circuit, where the fifth CRC calculation circuit and the fourth CRC calculation circuit are different CRC calculation circuits.

For example, the fifth CRC calculation circuit is configured, so as to calculate CRC of a binary sequence having J bits, where J is a positive integer, and J is greater than or equal to B.

For example, the fifth CRC calculation circuit and the first CRC calculation circuit may be a same CRC calculation circuit.

Optionally, the CRC calculation circuit in the foregoing embodiment includes a first data exclusive OR calculation circuit. Using the first CRC calculation circuit as an example, the first data exclusive OR calculation circuit is expressed as:

$$\mathrm{CRC\_D}_n = [\, P \quad H*P \quad L \quad H^{n-1}*P\,] * \begin{bmatrix} d_{n-1} \\ d_{n-2} \\ M \\ d_0 \end{bmatrix},$$

where $d_0$ to $d_{n-1}$ in $$\begin{bmatrix} d_{n-1} \\ d_{n-2} \\ M \\ d_0 \end{bmatrix}$$

are respectively a least significant bit to a most significant bit of the binary sequence having the M bits, and a value of n is M; and $$P = \begin{bmatrix} p_{m-1} \\ M \\ p_1 \\ p_0 \end{bmatrix}$$

is a generator polynomial matrix, $p_{m-1}$ to $p_0$ are CRC polynomial coefficients of the first CRC calculation circuit, m is a degree of a generator polynomial, and $$H = \begin{bmatrix} p_{m-1} & 1 & 0 & L & 0 & 0 \\ p_{m-2} & 0 & 1 & & & 0 \\ p_{m-3} & & & O & & 0 \\ M & & & & 1 & M \\ p_1 & 0 & 0 & L & 0 & 1 \\ p_0 & 0 & 0 & 0 & 0 & 0 \end{bmatrix}_{m*m}$$

is a transformation matrix.

Optionally, the second CRC calculation circuit includes a second data exclusive OR calculation circuit, and the second data exclusive OR calculation circuit is expressed as:

$$CRC\_D_n = [\, P \quad H*P \quad L \quad H^{n-1}*P \,] * \begin{bmatrix} d_{n-1} \\ d_{n-2} \\ M \\ d_0 \end{bmatrix},$$

where $d_0$ to $d_{n-1}$ in $$\begin{bmatrix} d_{n-1} \\ d_{n-2} \\ M \\ d_0 \end{bmatrix}$$

are respectively a least significant bit to a most significant bit of the binary sequence having the M bits, and a value of n is N; and $$P = \begin{bmatrix} p_{m-1} \\ M \\ p_1 \\ p_0 \end{bmatrix}$$

is a generator polynomial entry matrix, $p_{m-1}$ to $p_0$ are CRC polynomial coefficients of the first CRC calculation circuit, m is a degree of a generator polynomial, and $$H = \begin{bmatrix} p_{m-1} & 1 & 0 & L & 0 & 0 \\ p_{m-2} & 0 & 1 & & & 0 \\ p_{m-3} & & & O & & 0 \\ M & & & & 1 & M \\ p_1 & 0 & 0 & L & 0 & 1 \\ p_0 & 0 & 0 & 0 & 0 & 0 \end{bmatrix}_{m*m}$$

is a transformation matrix.

The foregoing embodiment uses only several typical application scenarios as examples to describe the present invention. The CRC calculation method provided in the foregoing embodiment may also be applied to another application scenario.

To understand the foregoing embodiment of the present invention more clearly, the following uses a typical application scenario as an example for description.

Referring to FIG. 1, FIG. 1 is a schematic diagram of a CRC calculation solution that may be applied to flexible Ethernet according to an embodiment of the present invention. As shown in the figure, for a given Ethernet system, a minimum length of an Ethernet packet is recorded as l (that is, the minimum length of the packet is l bits). If the number of bits in a binary sequence received by a receiver in each pulse is recorded as $P_{len}$, the maximum number of packets that may be included in a binary sequence of each pulse is:

$$N = \left\lceil \frac{P_{len}}{l} \right\rceil + 1$$

where [●] indicates rounding up to an integer, that is, a minimum integer greater than or equal to $$\frac{P_{len}}{l}$$

is obtained.

In this way, in the CRC calculation architecture, the number of CRC calculation circuits may be set to N (for example, Calc_CRC_1, Calc_CRC_2, . . . , Calc_CRC_N that are shown in the figure). Each CRC calculation circuit is configured, so as to concurrently calculate CRC of a binary sequence having specific bits.

A scheduling unit is configured to distribute a packet included in a binary sequence of a pulse to a corresponding CRC calculation circuit. A binary sequence of one packet is distributed to one CRC calculation circuit. The scheduling unit may be implemented by using a logic circuit.

As mentioned above, each CRC calculation circuit is configured, so as to concurrently calculate CRC of a binary sequence having specific bits. Preferably, the scheduling unit may perform distribution according to a sequence of "Calc_CRC_1, Calc_CRC_2, . . . , Calc_CRC_N" when performing packet distribution, that is, always perform distribution by starting from a CRC calculation circuit with a minimum number and according to a sequence of a progressive increase in numbers. In this way, the number of bits in a binary sequence that can be processed by a CRC calculation circuit may be progressively decreased according to a sequence in which numbers of the CRC calculation circuits are progressively increased.

Using an application scenario of a MAC (Media Access Control, Media Access Control) frame with 400G traffic as an example, according to an Ethernet standard, if a minimum length of a packet is 512 bits, and a 64b/66b codec is used, a size of an alignment block is 64 bits (that is, a minimum data processing granularity is 64 bits, that is, data processing is performed on a basis of at least 64 bits). Using that the number of bits in a binary sequence of each pulse is 1280 as an example, a binary sequence of one pulse may include a maximum of four packets, that is, CRC of the maximum of four packets needs to be calculated, and therefore, a maximum of four CRC calculation circuits may be set in the CRC calculation architecture.

Packets included in a binary sequence of each pulse is sorted according to a sequence, for example, if a binary sequence of a pulse includes high order bit parts of a complete packet (which is recorded as a packet a) and a packet (which is recorded as a packet b), a first packet in a binary sequence of a next pulse is residual bits in the packet b. The packets included in the binary sequence of each pulse are sequentially scheduled to corresponding Calc_CRC_K (K=1, 2, 3, and 4) for calculating CRC. For example, the first packet is scheduled to Calc_CRC_1, a second packet is scheduled to Calc_CRC_2, a third packet is scheduled to Calc_CRC_3, and a fourth packet is scheduled to Calc_CRC_4.

If a binary sequence of a pulse includes only one packet, and the number of bits in the packet is 1280, the packet is scheduled to Calc_CRC_1 for calculating CRC; if a binary sequence of a pulse includes only two packets, the minimum number of bits in a first packet is 64, and the maximum number of bits in a second packet is 1216 (1280 bits−64 bits=1216 bits); if a binary sequence of a pulse includes three packets, the minimum number of bits in a first packet is 64, the minimum number of bits in a second packet is 512, and the maximum number of bits in a third packet is 704 (1280 bits−64 bits−512 bits=704 bits); and if a binary sequence of a pulse includes four packets, the minimum number of bits in a first packet is 64, the minimum number of bits in a second packet is 512, the minimum number of bits in a third packet is 512, and a fourth packet includes only high order 192 bits (1280 bits−64 bits−512 bits−512 bits=192 bits) of the binary sequence.

According to the foregoing situations, as long as corresponding Calc_CRC meets a processing requirement of a longest packet. Therefore, each CRC calculation circuit is configured as follows:

Calc_CRC_1 is configured, so as to concurrently calculate CRC of a binary sequence having 1280 bits;

Calc_CRC_2 is configured, so as to concurrently calculate CRC of a binary sequence having 1216 bits;

Calc_CRC_3 is configured, so as to concurrently calculate CRC of a binary sequence having 704 bits; and Calc_CRC_4 is configured, so as to concurrently calculate CRC of a binary sequence having 192 bits.

Correspondingly, a data exclusive OR network operation part of Calc_CRC_1 may be expressed as:

$$CRC\_D_{1280} = [P \quad H*P \quad L \quad H^{1279}*P] * \begin{bmatrix} d_{1279} \\ d_{1278} \\ M \\ d_0 \end{bmatrix};$$

a data exclusive OR network operation part of Calc_CRC_2 may be expressed as:

$$CRC\_D_{1216} = [P \quad H*P \quad L \quad H^{1215}*P] * \begin{bmatrix} d_{1215} \\ d_{1214} \\ M \\ d_0 \end{bmatrix};$$

a data exclusive OR network operation part of Calc_CRC_3 may be expressed as:

$$CRC\_D_{704} = [P \quad H*P \quad L \quad H^{703}*P] * \begin{bmatrix} d_{703} \\ d_{702} \\ M \\ d_0 \end{bmatrix};$$

and a data exclusive OR network operation part of Calc_CRC_4 may be expressed as:

$$CRC\_D_{192} = [P \quad H*P \quad L \quad H^{191}*P] * \begin{bmatrix} d_{191} \\ d_{190} \\ M \\ d_0 \end{bmatrix}.$$

A CRC calculation structure of the foregoing MAC frame with 400G traffic may be shown in FIG. 2.

According to the foregoing principles, by extension, a configuration principle of a CRC calculation circuit may be that:

an $x^{th}$ (x=1) CRC calculation circuit is configured, so as to concurrently calculate CRC of a binary sequence having $P_{len}$ bits ($P_{len}$ is the number of bits in a binary sequence of each pulse), and the number of bits processed by an $(x+1)^{th}$ CRC calculation circuit is M bits less than the number of bits processed by the $x^{th}$ calculation circuit (M is a size of an alignment block); and the number of bits processed by a $(y+1)^{th}$ (2≤y≤N−1, N is the number of CRC calculation circuits) CRC calculation circuit is K bits (K is a minimum frame length) less than the number of bits processed by a $y^{th}$ CRC calculation circuit.

A solution in which a CRC calculation circuit is configured according to the foregoing principles is only a preferable implementation solution, and configuration for a CRC calculation circuit in this embodiment of the present invention, that is, the number of bits that can be processed by one CRC calculation circuit constitutes no limitation on the present invention.

An embodiment of the present invention further provides an apparatus that can implement the method shown in FIG. 3.

Figure 4:
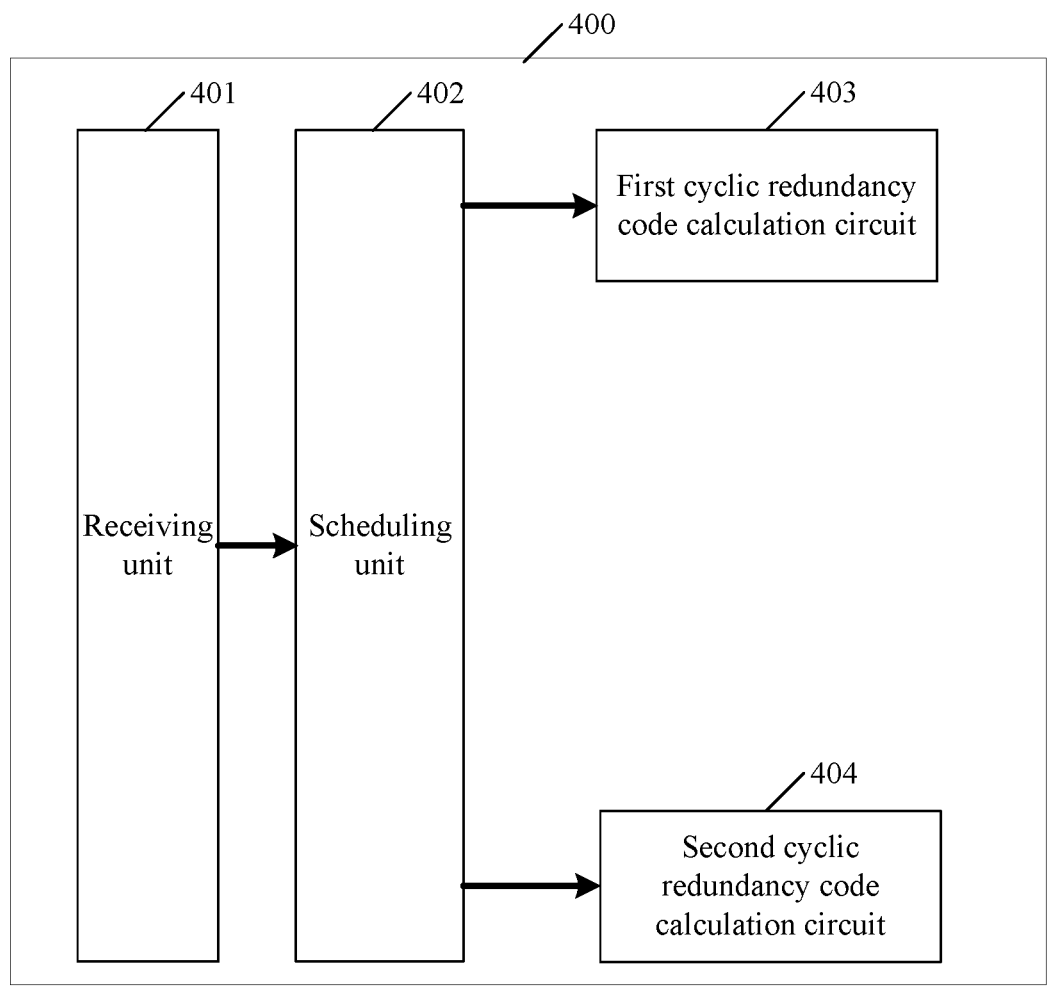
FIG. 4 is a schematic structural diagram of a CRC calculation apparatus according to an embodiment of the present invention.

Referring to FIG. 4, FIG. 4 is a schematic structural diagram of a CRC calculation apparatus according to an embodiment of the present invention. The apparatus may be configured to execute the method shown in FIG. 3. The apparatus may be a MAC, a MAC chip, a system chip, a receiver, or a multiport Ethernet device. Referring to FIG. 4, the apparatus 400 includes: a receiving unit 401, a scheduling unit 402, a first CRC calculation circuit 403, and a second CRC calculation circuit 404.

The receiving unit 401 is configured to receive a binary sequence of a first pulse, where the binary sequence of the first pulse includes a first packet and a second packet, the number of bits in the first packet is M, the number of bits in the second packet is N, M and N are positive integers, and M is unequal to N.

For example, the receiving unit 401 may be a dispatcher of a MAC. The binary sequence may be output by an RS of the MAC.

For example, the first packet is an Ethernet frame. The second packet is an Ethernet frame. The first pulse is corresponding to one clock cycle of a clock apparatus. The clock apparatus is configured to drive the receiving unit 401 to receive the binary sequence of the first pulse.

For example, the first packet may be a packet sent by a first transmitter. The second packet may be a packet sent by a second transmitter. Specifically, the first transmitter sends the first packet by using a first Ethernet interface. The second transmitter sends the second packet by using a second Ethernet interface. A type of the first Ethernet interface may be different from a type of the second Ethernet interface. For example, the first Ethernet interface may be a 40GE interface. The second Ethernet interface may be a 100GE interface. The first transmitter may be a transmitter of a first network apparatus. The second transmitter may be a transmitter of a second network apparatus. The first network apparatus and the second network apparatus may be different network apparatuses.

The scheduling unit 402 is configured to distribute the first packet received by the receiving unit 401 to the first CRC calculation circuit 403, and distribute the second packet received by the receiving unit 401 to the second CRC calculation circuit 404.

For example, the scheduling unit 402 may be the dispatcher.

The first CRC calculation circuit 403 is configured to calculate CRC of the first packet distributed by the scheduling unit 402.

Specifically, the first CRC calculation circuit 403 is configured, so as to calculate the CRC of the binary sequence having the M bits.

The second CRC calculation circuit 404 is configured to calculate CRC of the second packet distributed by the scheduling unit 402.

Specifically, the second CRC calculation circuit 404 is configured, so as to calculate the CRC of the binary sequence having the N bits.

Optionally, according to the apparatus shown in FIG. 4, the apparatus 400 further includes a third CRC calculation circuit (which is not shown in FIG. 4). The binary sequence of the first pulse further includes a third packet, where the number of bits in the third packet is X.

The scheduling unit 402 is further configured to:

generate a first binary sequence according to the third packet received by the receiving unit 401, where the number of bits in the first binary sequence is Y, a value of high order X bits in the first binary sequence is equal to a value of the bits in the third packet, a value of low order C bits in the first binary sequence is equal to 0, Y=X+C, and Y, X, and C are positive integers; and distribute the first binary sequence to the third CRC calculation circuit.

For example, the scheduling unit 402 may include a shift register. The shift register may execute a shift operation on the third packet, so as to generate the first binary sequence.

The third CRC calculation circuit is configured to calculate CRC of the first binary sequence distributed by the scheduling unit 402.

Optionally, according to the apparatus shown in FIG. 4, the apparatus 400 further includes a fourth CRC calculation circuit (which is not shown in FIG. 4), the binary sequence of the first pulse further includes high order A bits in a fourth packet, where the number of bits in the fourth packet is A+B.

For example, the fourth CRC calculation circuit is configured, so as to calculate CRC of a binary sequence having G bits.

The scheduling unit 402 is further configured to:

generate a second binary sequence according to the high order A bits in the fourth packet received by the receiving unit 401, where the number of bits in the second binary sequence is a value of high order A bits in the second binary sequence is equal to a value of the high order A bits in the fourth packet, a value of low order H bits in the second binary sequence is equal to 0, G=A+H, A, B, and G are positive integers, H is an integer greater than or equal to 0, and B is less than or equal to G;

for example, when H is a positive integer, a shift operation may be executed on the high order A bits in the fourth packet to obtain the second binary sequence, and when H is 0, the second binary sequence is equal to the high order A bits in the fourth packet; and distribute the second binary sequence to the fourth CRC calculation circuit.

The fourth CRC calculation circuit is configured to calculate CRC of the second binary sequence to initialize a value of a CRC register of the fourth CRC calculation circuit.

The receiving unit 401 is further configured to receive a binary sequence of a second pulse, where the second pulse is a pulse following the first pulse, and the binary sequence of the second pulse includes low order B bits in the fourth packet; and distribute the low order B bits in the fourth packet to the fourth CRC calculation circuit.

The fourth CRC calculation circuit is further configured to calculate CRC of the low order B bits in the fourth packet by using the CRC of the second binary sequence distributed by the scheduling unit 402 as an initial value of the CRC register of the fourth CRC calculation circuit.

Alternatively, according to the apparatus shown in FIG. 4, the apparatus 400 further includes a fourth CRC calculation circuit (which is not shown in FIG. 4) and a fifth CRC calculation circuit (which is not shown in FIG. 4). The binary sequence of the first pulse further includes high order A bits in a fourth packet, where the number of bits in the fourth packet is A+B.

For example, the fourth CRC calculation circuit is configured, so as to calculate CRC of a binary sequence having G bits.

The scheduling unit 402 is further configured to:

generate a second binary sequence according to the high order A bits in the fourth packet received by the receiving unit 401, where the number of bits in the second binary sequence is a value of high order A bits in the second binary sequence is equal to a value of the high order A bits in the fourth packet, a value of low order H bits in the second binary sequence is equal to 0, G=A+H, A, B, and G are positive integers, and H is an integer greater than or equal to 0;

for example, when H is a positive integer, a shift operation may be executed on the high order A bits in the fourth packet to obtain the second binary sequence, and when H is 0, the second binary sequence is equal to the high order A bits in the fourth packet; and distribute the second binary sequence to the fourth CRC calculation circuit.

The fourth CRC calculation circuit is configured to calculate CRC of the second binary sequence according to the second binary sequence distributed by the scheduling unit 402.

The receiving unit 401 is further configured to receive a binary sequence of a second pulse, where the second pulse is a pulse following the first pulse, and the binary sequence of the second pulse includes low order B bits in the fourth packet; and distribute the low order B bits in the fourth packet to the fifth CRC calculation circuit.

The fifth CRC calculation circuit is configured to calculate CRC of the low order B bits in the fourth packet by using the CRC of the second binary sequence distributed by the scheduling unit 402 as an initial value of a CRC register of the fifth CRC calculation circuit.

For example, the fifth CRC calculation circuit is configured, so as to calculate CRC of a binary sequence having J bits, where J is a positive integer, and J is greater than or equal to B.

For example, the fifth CRC calculation circuit and the first CRC calculation circuit may be a same CRC calculation circuit.

Optionally, according to the apparatus shown in FIG. 4, the first CRC calculation circuit 403 includes a first data exclusive OR calculation circuit. The first data exclusive OR calculation circuit is expressed as:

$$CRC\_D_n = [\begin{array}{cccc} P & H*P & L & H^{n-1}*P \end{array}] * \begin{bmatrix} d_{n-1} \\ d_{n-2} \\ M \\ d_0 \end{bmatrix},$$

where $d_0$ to $d_{n-1}$ in $$\begin{bmatrix} d_{n-1} \\ d_{n-2} \\ M \\ d_0 \end{bmatrix}$$

are respectively a least significant bit to a most significant bit of the binary sequence having the M bits, and a value of n is M; and $$P = \begin{bmatrix} p_{m-1} \\ M \\ p_1 \\ p_0 \end{bmatrix}$$

is a generator polynomial matrix, $p_{m-1}$ to $p_0$ are CRC polynomial coefficients of the first CRC calculation circuit, m is a degree of a generator polynomial, and $$H = \begin{bmatrix} p_{m-1} & 1 & 0 & L & 0 & 0 \\ p_{m-2} & 0 & 1 & & & 0 \\ p_{m-3} & & & O & & 0 \\ M & & & & 1 & M \\ p_1 & 0 & 0 & L & 0 & 1 \\ p_0 & 0 & 0 & 0 & 0 & 0 \end{bmatrix}_{m*m}$$

is a transformation matrix.

The second CRC calculation circuit includes a second data exclusive OR calculation circuit. The second data exclusive OR calculation circuit is expressed as:

$$CRC\_D_n = [\begin{array}{cccc} P & H*P & L & H^{n-1}*P \end{array}] * \begin{bmatrix} d_{n-1} \\ d_{n-2} \\ M \\ d_0 \end{bmatrix},$$

where $d_0$ to $d_{n-1}$ in $$\begin{bmatrix} d_{n-1} \\ d_{n-2} \\ M \\ d_0 \end{bmatrix}$$

are respectively a least significant bit to a most significant bit of the binary sequence having the M bits, and a value of n is N; and $$P = \begin{bmatrix} p_{m-1} \\ M \\ p_1 \\ p_0 \end{bmatrix}$$

is a generator polynomial entry matrix, $p_{m-1}$ to $p_0$ are CRC polynomial coefficients of the first CRC calculation circuit, m is a degree of a generator polynomial, and $$H = \begin{bmatrix} p_{m-1} & 1 & 0 & L & 0 & 0 \\ p_{m-2} & 0 & 1 & & & 0 \\ p_{m-3} & & & O & & 0 \\ M & & & & 1 & M \\ p_1 & 0 & 0 & L & 0 & 1 \\ p_0 & 0 & 0 & 0 & 0 & 0 \end{bmatrix}_{m*m}$$

is a transformation matrix.

Figure 5:
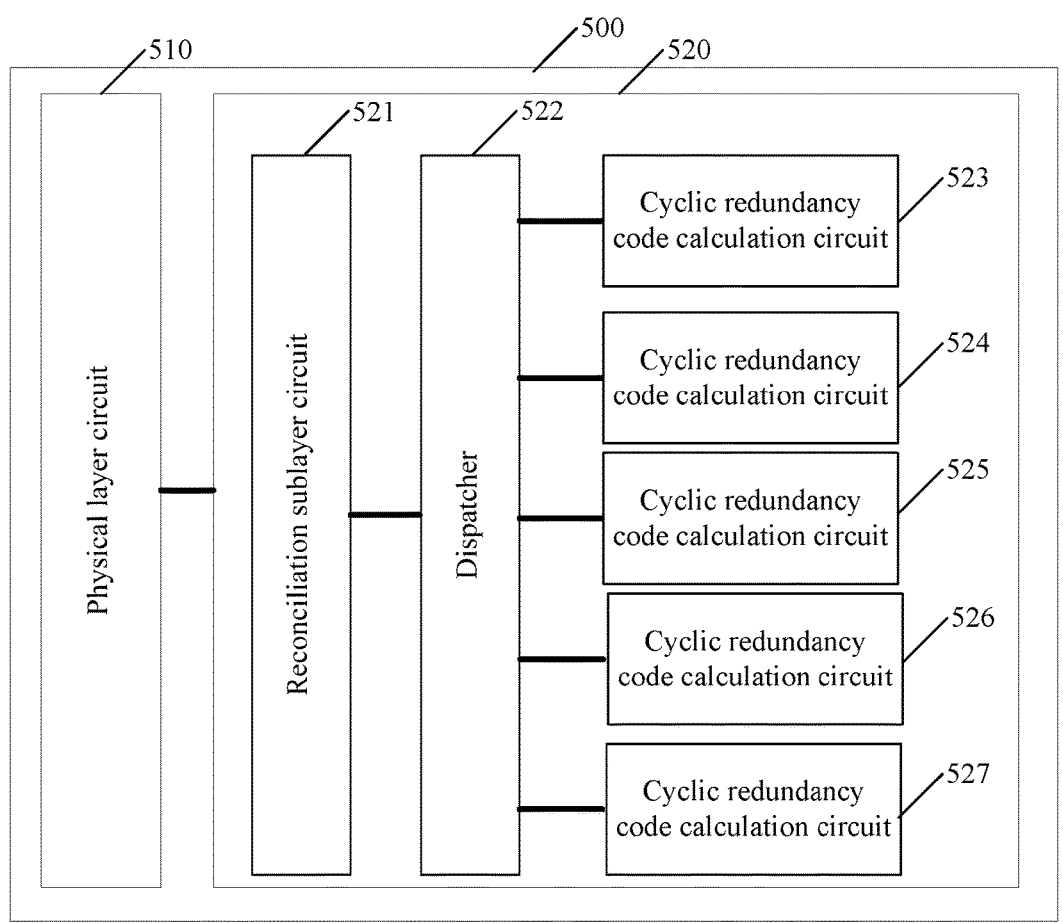
FIG. 5 is a schematic structural diagram of a system chip according to an embodiment of the present invention.

FIG. 5 is a schematic structural diagram of a system chip according to an embodiment of the present invention. A system chip 500 may be configured to execute the method shown in FIG. 3. Referring to FIG. 5, the system chip 500 includes a PHY 510 (which is a physical layer circuit 510 shown in the figure) and a MAC 520. The MAC 520 includes an RS 521 (which is a reconciliation sublayer circuit 521 shown in the figure), a dispatcher 522, and a CRC calculation circuit 523 to a CRC calculation circuit 527. The PHY 510 is connected to the MAC 520 by using an MII. The RS 521 is coupled with the dispatcher 522. The dispatcher 522 is coupled with the CRC calculation circuit 523 to the CRC calculation circuit 527. The MAC 520 may work under driving of a clock apparatus. Specifically, the RS 521, the dispatcher 522, and the CRC calculation circuit 523 to the CRC calculation circuit 527 work under driving of the clock apparatus.

The RS 521 sends a binary sequence of a first clock cycle to the dispatcher 522 in the first clock cycle under driving of the clock apparatus. The binary sequence of the first clock cycle includes a first packet and a second packet. The number of bits in the first packet is M. The number of bits in the second packet is N. M and N are positive integers. M is unequal to N. The first packet is an Ethernet frame. The second packet is an Ethernet frame.

The dispatcher 522 receives the binary sequence of the first clock cycle under driving of the clock apparatus.

The dispatcher 522 distributes the first packet to a first CRC calculation circuit, where the first CRC calculation circuit calculates CRC of the first packet. The CRC calculation circuit 523 is the first CRC calculation circuit.

The dispatcher 522 distributes the second packet to a second CRC calculation circuit, where the second CRC calculation circuit calculates CRC of the second packet. The CRC calculation circuit 524 is the second CRC calculation circuit.

Optionally, in the foregoing technical solution, the binary sequence of the first clock cycle further includes a third packet, where the number of bits in the third packet is X.

The dispatcher 522 generates a first binary sequence according to the third packet, where the number of bits in the first binary sequence is Y, a value of high order X bits in the first binary sequence is equal to a value of the bits in the third packet, a value of low order C bits in the first binary sequence is equal to 0, Y=X+C, and Y, X, and C are positive integers.

For example, the third packet is an Ethernet frame. The dispatcher 522 includes a shift register. The shift register performs a shift operation on the third packet to obtain the first binary sequence.

The dispatcher 522 distributes the first binary sequence to a third CRC calculation circuit, where the third CRC calculation circuit calculates CRC of the first binary sequence. The CRC calculation circuit 525 is the third CRC calculation circuit.

Optionally, in the foregoing technical solution, the binary sequence of the first clock cycle further includes high order A bits in a fourth packet, where the number of bits in the fourth packet is A+B. The fourth packet is an Ethernet frame.

For example, a fourth CRC calculation circuit is configured, so as to calculate CRC of a binary sequence having G bits.

The dispatcher 522 generates a second binary sequence according to the high order A bits in the fourth packet, where the number of bits in the second binary sequence is a value of high order A bits in the second binary sequence is equal to a value of the high order A bits in the fourth packet, a value of low order H bits in the second binary sequence is equal to 0, G=A+H, A, B, and G are positive integers, H is an integer greater than or equal to 0, and B is less than or equal to G.

For example, when H is a positive integer, a shift operation may be executed on the high order A bits in the fourth packet to obtain the second binary sequence, and when H is 0, the second binary sequence is equal to the high order A bits in the fourth packet.

The dispatcher 522 distributes the second binary sequence to the fourth CRC calculation circuit, where the fourth CRC calculation circuit calculates CRC of the second binary sequence to initialize a value of a CRC register of the fourth CRC calculation circuit.

The dispatcher 522 receives a binary sequence that is sent in a second clock cycle by the RS 521 under driving of the clock apparatus. The second clock cycle is a clock cycle following the first clock cycle. The binary sequence of the second clock cycle includes low order B bits in the fourth packet.

The dispatcher 522 distributes the low order B bits in the fourth packet to the fourth CRC calculation circuit. The CRC calculation circuit 526 is the fourth CRC calculation circuit.

The fourth CRC calculation circuit calculates CRC of the low order B bits in the fourth packet by using the CRC of the second binary sequence as an initial value of the CRC register of the fourth CRC calculation circuit.

Alternatively, in the foregoing technical solution, the binary sequence of the first clock cycle further includes high order A bits in a fourth packet, where the number of bits in the fourth packet is A+B.

For example, a fourth CRC calculation circuit is configured, so as to calculate CRC of a binary sequence having G bits.

The dispatcher 522 generates a second binary sequence according to the high order A bits in the fourth packet, where the number of bits in the second binary sequence is a value of high order A bits in the second binary sequence is equal to a value of the high order A bits in the fourth packet, a value of low order H bits in the second binary sequence is equal to 0, G=A+H, A, B, and G are positive integers, and H is an integer greater than or equal to 0.

For example, when H is a positive integer, a shift operation may be executed on the high order A bits in the fourth packet to obtain the second binary sequence, and when H is 0, the second binary sequence is equal to the high order A bits in the fourth packet.

The dispatcher 522 distributes the second binary sequence to the fourth CRC calculation circuit, where the fourth CRC calculation circuit calculates CRC of the second binary sequence. The CRC calculation circuit 526 is the fourth CRC calculation circuit.

The dispatcher 522 receives a binary sequence that is sent in a second clock cycle by the RS 521 under driving of the clock apparatus. The second clock cycle is a clock cycle following the first clock cycle. The binary sequence of the second clock cycle includes low order B bits in the fourth packet.

The dispatcher 522 distributes the low order B bits in the fourth packet to a fifth CRC calculation circuit. The fifth CRC calculation circuit calculates CRC of the low order B bits in the fourth packet by using the CRC of the second binary sequence as an initial value of a CRC register of the fifth CRC calculation circuit. The CRC calculation circuit 527 is the fifth CRC calculation circuit.

For example, the fifth CRC calculation circuit is configured, so as to calculate CRC of a binary sequence having J bits, where J is a positive integer, and J is greater than or equal to B.

For example, the fifth CRC calculation circuit and the first CRC calculation circuit may be a same CRC calculation circuit.

Optionally, the first CRC calculation circuit includes a first data exclusive OR calculation circuit. The first data exclusive OR calculation circuit is expressed as:

$$CRC\_D_n = [P \quad H*P \quad L \quad H^{n-1}*P] * \begin{bmatrix} d_{n-1} \\ d_{n-2} \\ M \\ d_0 \end{bmatrix},$$

where $d_0$ to $d_{n-1}$ in $$\begin{bmatrix} d_{n-1} \\ d_{n-2} \\ M \\ d_0 \end{bmatrix}$$

are respectively a least significant bit to a most significant bit of the binary sequence having the M bits, and a value of n is N; and $$P = \begin{bmatrix} p_{m-1} \\ M \\ p_1 \\ p_0 \end{bmatrix}$$

is a generator polynomial matrix, $p_{m-1}$ to $p_0$ are CRC polynomial coefficients of the first CRC calculation circuit, m is a degree of a generator polynomial, and $$H = \begin{bmatrix} p_{m-1} & 1 & 0 & L & 0 & 0 \\ p_{m-2} & 0 & 1 & & & 0 \\ p_{m-3} & & & O & & 0 \\ M & & & & 1 & M \\ p_1 & 0 & 0 & L & 0 & 1 \\ p_0 & 0 & 0 & 0 & 0 & 0 \end{bmatrix}_{m*m}$$

is a transformation matrix.

Optionally, the second CRC calculation circuit includes a second data exclusive OR calculation circuit, and the second data exclusive OR calculation circuit is expressed as:

$$CRC\_D_n = [P \quad H*P \quad L \quad H^{n-1}*P] * \begin{bmatrix} d_{n-1} \\ d_{n-2} \\ M \\ d_0 \end{bmatrix},$$

where $d_0$ to $d_{n-1}$ in $$\begin{bmatrix} d_{n-1} \\ d_{n-2} \\ M \\ d_0 \end{bmatrix}$$

are respectively a least significant bit to a most significant bit of the binary sequence having the M bits, and a value of n is N; and $$P = \begin{bmatrix} p_{m-1} \\ M \\ p_1 \\ p_0 \end{bmatrix}$$

is a generator polynomial entry matrix, $p_{m-1}$ to $p_0$ are CRC polynomial coefficients of the first CRC calculation circuit, m is a degree of a generator polynomial, and $$H = \begin{bmatrix} p_{m-1} & 1 & 0 & L & 0 & 0 \\ p_{m-2} & 0 & 1 & & & 0 \\ p_{m-3} & & & O & & 0 \\ M & & & & 1 & M \\ p_1 & 0 & 0 & L & 0 & 1 \\ p_0 & 0 & 0 & 0 & 0 & 0 \end{bmatrix}_{m*m}$$

is a transformation matrix.

Figure 6:
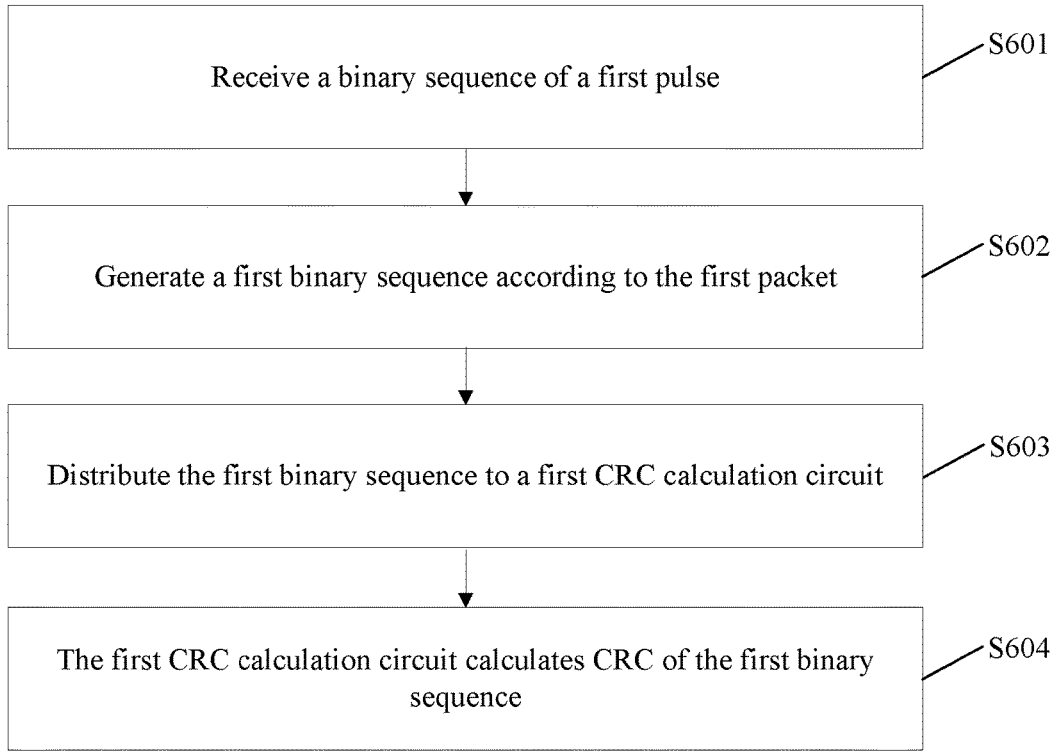
FIG. 6 is a schematic flowchart of a CRC calculation method according to an embodiment of the present invention.

FIG. 6 is a schematic flowchart of a CRC calculation method according to an embodiment of the present invention. The method may be executed by a MAC, a MAC chip, a system chip, a receiver, or a multiport Ethernet device. Referring to FIG. 6, the method includes:

S601: Receive a binary sequence of a first pulse.

Specifically, the binary sequence of the first pulse includes a first packet. The number of bits in the first packet is X.

For example, S601 may be executed by a dispatcher of a MAC. The binary sequence may be output by an RS of the MAC.

For example, the first packet is an Ethernet frame. The first pulse is corresponding to one clock cycle of a clock apparatus. The clock apparatus is configured to drive an execution body of the method shown in FIG. 6 to receive the binary sequence of the first pulse.

S602: Generate a first binary sequence according to the first packet.

For example, S601 may be executed by the dispatcher. The dispatcher may include a shift register. The shift register may execute a shift operation on the first packet to obtain the first binary sequence.

Specifically, the number of bits in the first binary sequence is Y, a value of high order X bits in the first binary sequence is equal to a value of the bits in the first packet, a value of low order C bits in the first binary sequence is equal to 0, Y=X+C, and Y, X, and C are positive integers.

S603: Distribute the first binary sequence to a first CRC calculation circuit.

For example, the first CRC calculation circuit is configured, so as to concurrently calculate CRC of a binary sequence having Y bits.

S604: The first CRC calculation circuit calculates CRC of the first binary sequence.

For example, the first CRC calculation circuit is corresponding to a scrambling polynomial. The first CRC calculation circuit calculates the CRC of the first binary sequence according to the scrambling polynomial.

In an application scenario of flexible Ethernet, the number of bits in a packet received by an Ethernet interface may be less than the number of bits in a binary sequence. The binary sequence refers to a binary sequence that is corresponding to CRC when a CRC calculation circuit calculates the CRC. By using the foregoing technical solution, CRC of a packet having less bits may be calculated. Therefore, the foregoing technical solution may be better applied to a scenario of flexible Ethernet.

Figure 7:
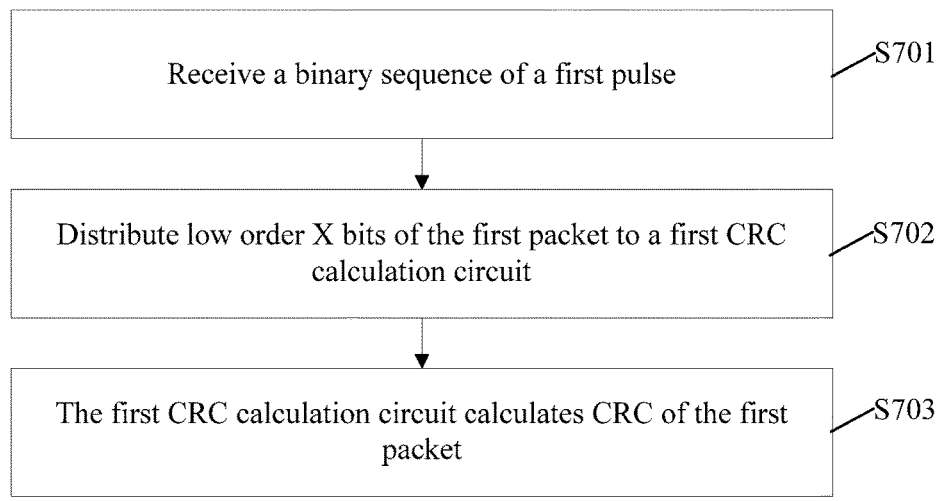
FIG. 7 is a schematic flowchart of a CRC calculation method according to an embodiment of the present invention.

FIG. 7 is a schematic flowchart of a CRC calculation method according to an embodiment of the present invention. The method may be executed by a MAC, a MAC chip, a system chip, a receiver, or a multiport Ethernet device. Specifically, the method may be executed by a dispatcher of the MAC and a CRC calculation circuit of the MAC. Referring to FIG. 7, the method includes:

S701: Receive a binary sequence of a first pulse.

Specifically, the binary sequence of the first pulse includes low order X bits in a first packet, where a most significant bit (most significant bit, MSB for short) of the low order X bits in the first packet is an MSB of the binary sequence of the first pulse.

A person skilled in the art may understand that: the low order X bits are located at the header of the binary sequence of the first pulse.

For example, S701 may be executed by a dispatcher of a MAC. The binary sequence of the first pulse may be output by an RS of the MAC.

For example, the first packet is an Ethernet frame. The second packet is an Ethernet frame. The first pulse is corresponding to one clock cycle of a clock apparatus. The clock apparatus is configured to drive an execution body of the method shown in FIG. 7 to receive the binary sequence of the first pulse.

S702: Distribute low order X bits in a first packet to a first CRC calculation circuit.

For example, S702 may be executed by the dispatcher.

Specifically, the number of bits in the binary sequence of the first pulse is N, where N is a positive integer.

For example, the first CRC calculation circuit is configured, so as to calculate CRC of a binary sequence having M bits. M is greater than or equal to N, and M is a positive integer.

S703: The first CRC calculation circuit calculates CRC of the first packet.

Figure 8:
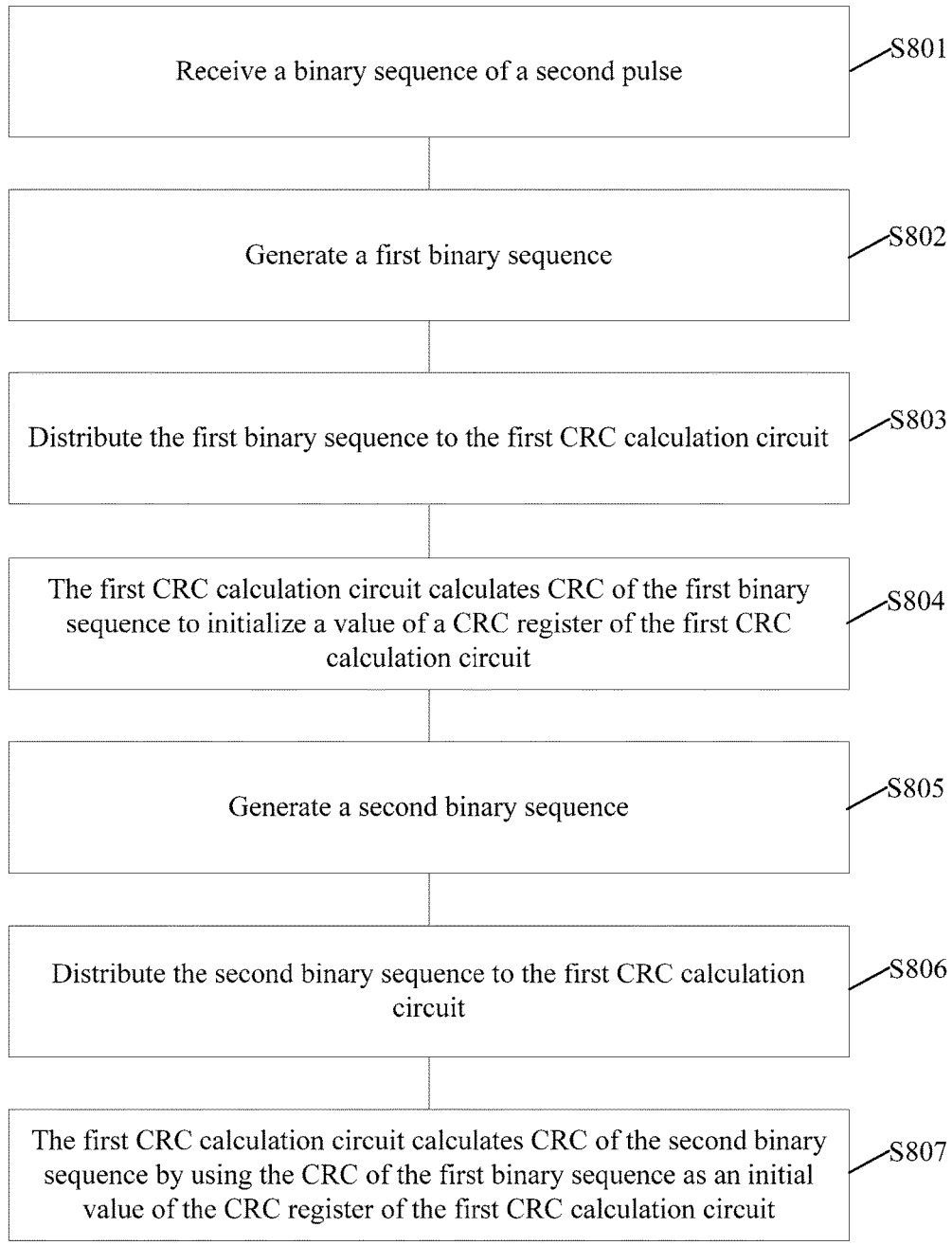
FIG. 8 is a schematic flowchart of a CRC calculation method according to an embodiment of the present invention.
Figure 9:
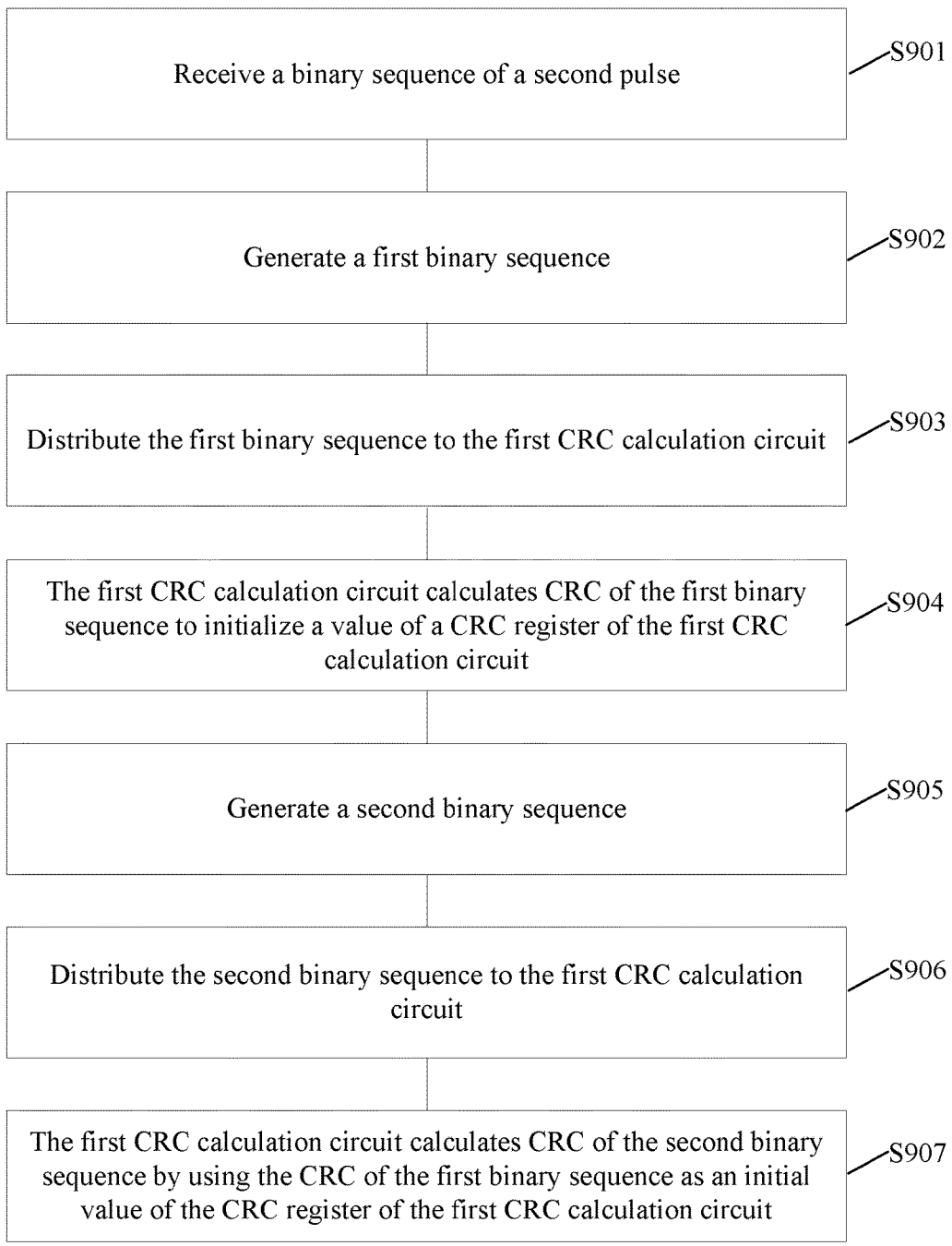
FIG. 9 is a schematic flowchart of a CRC calculation method according to an embodiment of the present invention.

S703 may be implemented by using two methods. FIG. 8 is a schematic flowchart of a first implementation manner of S703. FIG. 9 is a schematic flowchart of a second implementation manner of S703.

Referring to FIG. 8, the first implementation manner of S703 includes:

S801: Receive a binary sequence of a second pulse.

Specifically, the binary sequence of the second pulse includes high order Y bits in the first packet. A sum of X and Y is equal to M. The number of bits in the first packet is the sum of X and Y.

S802: Generate a first binary sequence.

Specifically, the number of bits in the first binary sequence is M. High order Y bits in the first binary sequence are equal to the high order Y bits in the first packet. Low order X bits in the first binary sequence are equal to 0. For example, a shift operation may be executed on the high order Y bits in the first packet by using a shift register to obtain the first binary sequence.

S803: Distribute the first binary sequence to the first CRC calculation circuit.

S804: The first CRC calculation circuit calculates CRC of the first binary sequence to initialize a value of a CRC register of the first CRC calculation circuit.

S805: Generate a second binary sequence.

Specifically, the number of bits in the second binary sequence is M. High order X bits in the second binary sequence are equal to the low order X bits in the first packet. Low order Y bits in the second binary sequence are equal to 0. For example, a shift operation may be executed on the low order X bits in the first packet by using a shift register to obtain the second binary sequence.

S806: Distribute the second binary sequence to the first CRC calculation circuit.

S807: The first CRC calculation circuit calculates CRC of the second binary sequence by using the CRC of the first binary sequence as an initial value of the CRC register of the first CRC calculation circuit.

The CRC of the second binary sequence is equal to the CRC of the first packet.

Referring to FIG. 9, the second implementation manner of S703 includes:

S901: Receive a binary sequence of a second pulse.

Specifically, the binary sequence of the second pulse includes high order Y bits in the first packet. A sum of X and Y is equal to S. S is less than M. The number of bits in the first packet is the sum of X and Y.

S902: Generate a first binary sequence.

Specifically, the number of bits in the first binary sequence is M. High order Y bits in the first binary sequence are equal to the high order Y bits in the first packet. Low order (M−Y) bits in the first binary sequence are equal to 0. For example, a shift operation may be executed on the high order Y bits in the first packet by using a shift register to obtain the first binary sequence.

S903: Distribute the first binary sequence to the first CRC calculation circuit.

S904: The first CRC calculation circuit calculates CRC of the first binary sequence to initialize a value of a CRC register of the first CRC calculation circuit.

S905: Generate a second binary sequence.

Specifically, the number of bits in the second binary sequence is M. High order X bits in the second binary sequence are equal to the low order X bits in the first packet. Low order (M−X) bits in the second binary sequence are equal to 0. For example, a shift operation may be executed on the low order X bits in the first packet by using a shift register to obtain the second binary sequence.

S906: Distribute the second binary sequence to the first CRC calculation circuit.

S907: The first CRC calculation circuit calculates CRC of the second binary sequence by using the CRC of the first binary sequence as an initial value of the CRC register of the first CRC calculation circuit.

The CRC of the second binary sequence is equal to the CRC of the first packet.

Optionally, in the technical solution shown in FIG. 7, the binary sequence of the first pulse includes a second packet, where the second packet is adjacent to the low order X bits in the first packet. The method further includes:

distributing the second packet to a second CRC calculation circuit; and calculating, by the second CRC calculation circuit, CRC of the second packet.

For example, the second CRC calculation circuit is configured, so as to calculate CRC of a binary sequence having A bits. Specifically, A is greater than or equal to B. B is equal to N minus the number of bits included in an alignment block, where the alignment block is corresponding to an alignment granularity of the packet, A is a positive integer, and B is a positive integer.

The following gives an example for an alignment block mechanism:

A network processor (network processor, NP for short) needs to perform a block division operation on an Ethernet frame before sending the Ethernet frame to a MAC, thereby implementing alignment of the Ethernet frame. Specifically, the Ethernet frame is divided into a plurality of data blocks, and the number of bits included in each data block is E. It should be noted that, one data block can include only one Ethernet frame segment, and cannot include two or more than two Ethernet frame segments. For example, E may be 64, or may be 250. If the number of bits in the last block in the Ethernet frame is less than E after the block division operation is executed on the Ethernet frame, padding data needs to be added to the end of the last block, thereby obtaining a data block whose number of bits is E. The data block to which the padding data is added may be referred to as an alignment block. The number of bits included in the alignment block is also E. E may be used for representing an alignment granularity of a packet.

For example, the number of bits in the second packet is equal to P. P is less than or equal to A. In a scenario in which P is equal to A, the second CRC calculation circuit may calculate CRC of the second packet. In a scenario in which P is less than A, a shift operation may be executed on the second packet to generate a new binary sequence. The number of bits in the new binary sequence is equal to A. High order P bits in the new binary sequence are equal to those of the second packet. Low order (A-P) bits in the new binary sequence are equal to 0. The second CRC calculation circuit may calculate CRC of the new binary sequence. The CRC of the new binary sequence is equal to the CRC of the second packet. In a scenario in which P is less than A, for how to calculate the CRC of the second packet, refer to the method shown in FIG. 6.

Optionally, in the foregoing technical solution, the binary sequence of the first pulse includes a third packet, where the third packet is adjacent to the second packet. The method further includes:

distributing the third packet to a third CRC calculation circuit; and calculating, by the third CRC calculation circuit, CRC of the third packet.

For example, the third CRC calculation circuit is configured, so as to calculate CRC of a binary sequence having C bits.

Specifically, C is greater than or equal to D. D is equal to N minus the number of bits included in the alignment block minus the number of bits included in a packet with a minimum length, where C is a positive integer, and D is a positive integer.

The minimum length refers to a minimum length of a packet stipulated for a communications system. For example, the first packet, the second packet, and the third packet all belong to the Ethernet frame. According to 802.3ba issued by the Institute of Electrical and Electronics Engineers (Institute of Electrical and Electronics Engineers, IEEE for short), a minimum length of an Ethernet frame is 512 bits in the 40GE standard, and a minimum length of an Ethernet frame is 512 bits in the 100GE standard.

For example, the number of bits in the third packet is equal to Q. Q is less than or equal to C. In a scenario in which Q is equal to C, the third CRC calculation circuit may calculate CRC of the third packet. In a scenario in which Q is less than C, a shift operation may be executed on the third packet to generate a new binary sequence. The number of bits in the new binary sequence is equal to C. High order Q bits in the new binary sequence are equal to those of the third packet. Low order (C-Q) bits in the new binary sequence are equal to 0. The third CRC calculation circuit may calculate CRC of the new binary sequence. The CRC of the new binary sequence is equal to the CRC of the third packet. In a scenario in which Q is less than C, for how to calculate the CRC of the third packet, refer to the method shown in FIG. 6.

Figure 10:
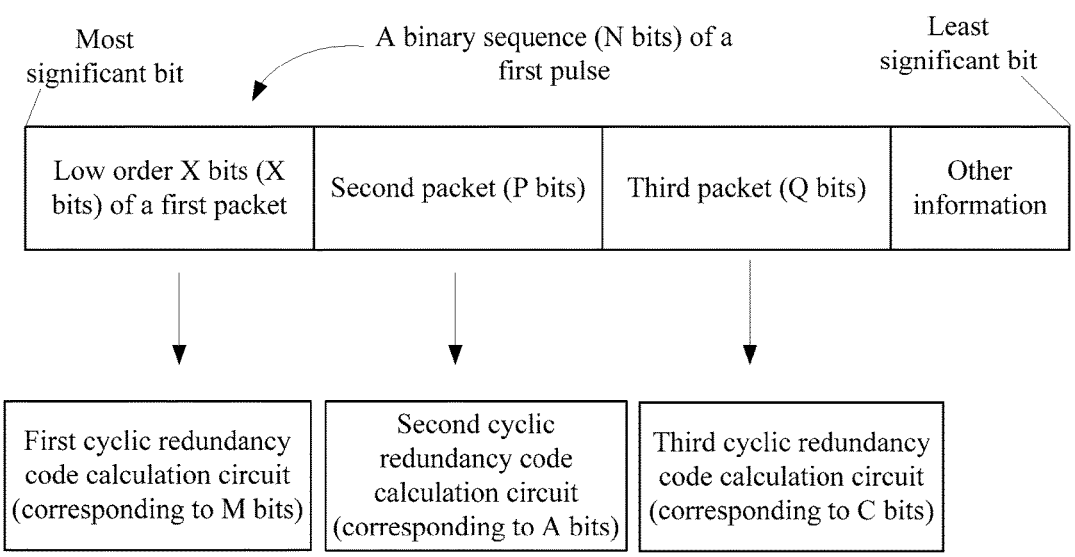
FIG. 10 is a schematic flowchart of a CRC calculation method according to an embodiment of the present invention.

FIG. 10 is a schematic diagram of a CRC calculation method according to an embodiment of the present invention. FIG. 10 shows a format of the binary sequence of the first pulse in the foregoing technical solution. Other information may be another packet, for example, a fourth packet. Certainly, the binary sequence of the first pulse may not include other information. In addition, FIG. 10 shows a relationship between the binary sequence of the first pulse and a CRC calculation circuit. Specifically, low order X bits in the first packet are distributed to the first CRC calculation circuit. The second packet is distributed to the second CRC calculation circuit. The third packet is distributed to the third CRC calculation circuit.

In the foregoing technical solution, the first CRC calculation circuit is configured, so as to calculate CRC of a binary sequence having M bits. M is greater than or equal to N. The number of bits in the binary sequence of the first pulse is N. The second CRC calculation circuit is configured, so as to calculate CRC of a binary sequence having A bits. Specifically, A is greater than or equal to B. B is equal to N minus the number of bits included in an alignment block. The third CRC calculation circuit is configured, so as to calculate CRC of a binary sequence having C bits. C is greater than or equal to D. D is equal to N minus the number of bits included in the alignment block minus the number of bits included in a packet with a minimum length. Therefore, resources that are of a hardware circuit and need to be occupied by the first CRC calculation circuit, the second CRC calculation circuit, and the third CRC calculation circuit may present a decreasing trend. Therefore, the foregoing technical solution helps save resources of a hardware circuit.

An embodiment of the present invention provides a CRC calculation circuit, where the CRC calculation circuit includes the first CRC calculation circuit, the second CRC calculation circuit, and the third CRC calculation circuit that are in the method shown in FIG. 7.

A person skilled in the art should understand that the embodiments of the present invention may be provided as a method, a system, or a computer program product. Therefore, the present invention may be implemented in the form of a complete hardware embodiment, a complete software embodiment, or a combination of software and hardware embodiments. Moreover, the present invention may use a form of a computer program product that is implemented on one or more computer-usable storage media (including but not limited to a disk memory, a CD-ROM, an optical memory, and the like) that include computer-usable program code.

The present invention is described with reference to the flowcharts and/or block diagrams of the method, the device (system), and the computer program product according to the embodiments of the present invention. It should be understood that computer program instructions may be used to implement each process and/or each block in the flowcharts and/or the block diagrams and a combination of a process and/or a block in the flowcharts and/or the block diagrams. These computer program instructions may be provided for a general-purpose computer, a dedicated computer, an embedded processor, or a processor of any other programmable data processing device, so that the instructions executed by a computer or a processor of any other programmable data processing device may implement a specified function in one or more processes in the flowcharts and/or in one or more blocks in the block diagrams.

These computer program instructions may also be stored in a computer readable memory that can instruct the computer or any other programmable data processing device to work in a specific manner, so that the instructions stored in the computer readable memory generate an artifact that includes an instruction apparatus. The instruction apparatus implements a specific function in one or more processes in the flowcharts and/or in one or more blocks in the block diagrams.

These computer program instructions may also be loaded onto a computer or another programmable data processing device, so that a series of operations and steps are performed on the computer or the another programmable device, thereby generating computer-implemented processing. Therefore, the instructions executed on the computer or the another programmable device provide steps for implementing a specific function in one or more processes in the flowcharts and/or in one or more blocks in the block diagrams.

Although some preferred embodiments of the present invention have been described, persons skilled in the art can make changes and modifications to these embodiments once they learn the basic inventive concept. Therefore, the following claims are intended to be construed as to cover the preferred embodiments and all changes and modifications falling within the scope of the present invention.

Obviously, a person skilled in the art can make various modifications and variations to the present invention without departing from the spirit and scope of the present invention. The present invention is intended to cover these modifications and variations provided that they fall within the scope of protection defined by the following claims and their equivalent technologies.

What is claimed is:

1. An error checking method applied in an Ethernet network, comprising:

receiving, by a circuit, a binary sequence of a first pulse, wherein the binary sequence of the first pulse comprises a first Ethernet frame and a second Ethernet frame, the number of bits in the first Ethernet frame is M, the number of bits in the second Ethernet frame is N, M and N are positive integers, and M is unequal to N;

distributing, by the circuit, the first Ethernet frame to a first cyclic redundancy check code (CRC) calculation circuit;

determining, by the first CRC calculation circuit, whether an error occurs in the first Ethernet frame by calculating CRC of the first Ethernet frame, wherein the first CRC calculation circuit is configured to calculate CRC of a binary sequence having M bits;

distributing, by the circuit, the second Ethernet frame to a second CRC calculation circuit; and determining, by the second CRC calculation circuit, whether an error occurs in the second Ethernet frame by calculating CRC of the second Ethernet frame, wherein the second CRC calculation circuit is configured to calculate CRC of a binary sequence having N bits.

2. The method according to claim 1, wherein the binary sequence of the first pulse further comprises a third Ethernet frame, and the number of bits in the third Ethernet frame is X; and the method further comprises:

generating, by the circuit, a first binary sequence according to the third Ethernet frame, wherein the number of bits in the first binary sequence is Y, a value of high order X bits in the first binary sequence is equal to a value of the bits in the third Ethernet frame, a value of low order C bits in the first binary sequence is equal to 0, Y=X+C, and Y, X, and C are positive integers; and distributing, by the circuit, the first binary sequence to a third CRC calculation circuit, wherein the third CRC calculation circuit calculates CRC of the first binary sequence.

3. The method according to claim 1, wherein the binary sequence of the first pulse further comprises high order A bits in a fourth Ethernet frame, and the number of bits in the fourth Ethernet frame is A+B; and the method further comprises:

generating, by the circuit, a second binary sequence according to the high order A bits in the fourth Ethernet frame, wherein the number of bits in the second binary sequence is G, a value of high order A bits in the second binary sequence is equal to a value of the high order A bits in the fourth Ethernet frame, a value of low order H bits in the second binary sequence is equal to 0, G=A+H, A, B, and G are positive integers, H is an integer greater than or equal to 0, and B is less than or equal to G;

distributing, by the circuit, the second binary sequence to a fourth CRC calculation circuit, wherein the fourth CRC calculation circuit calculates CRC of the second binary sequence to initialize a value of a CRC register of the fourth CRC calculation circuit;

receiving, by the circuit, a binary sequence of a second pulse, wherein the second pulse is a pulse following the first pulse, and the binary sequence of the second pulse comprises low order B bits in the fourth Ethernet frame; and distributing, by the circuit, the low order B bits in the fourth Ethernet frame to the fourth CRC calculation circuit, wherein the fourth CRC calculation circuit calculates CRC of the low order B bits in the fourth Ethernet frame by using the CRC of the second binary sequence as the initial value of the CRC register of the fourth CRC calculation circuit.

4. The method according to claim 1, wherein the binary sequence of the first pulse further comprises high order A bits in a fourth Ethernet frame, and the number of bits in the fourth Ethernet frame is A+B; and the method further comprises:

generating, by the circuit, a second binary sequence according to the high order A bits in the fourth Ethernet frame, wherein the number of bits in the second binary sequence is G, a value of high order A bits in the second binary sequence is equal to a value of the high order A bits in the fourth Ethernet frame, a value of low order H bits in the second binary sequence is equal to 0, G=A+H, A, B, and G are positive integers, and H is an integer greater than or equal to 0;

distributing, by the circuit, the second binary sequence to a fourth CRC calculation circuit, wherein the fourth CRC calculation circuit calculates CRC of the second binary sequence;

receiving, by the circuit, a binary sequence of a second pulse, wherein the second pulse is a pulse following the first pulse, and the binary sequence of the second pulse comprises low order B bits in the fourth Ethernet frame; and distributing, by the circuit, the low order B bits in the fourth Ethernet frame to a fifth CRC calculation circuit, wherein the fifth CRC calculation circuit calculates CRC of the low order B bits in the fourth Ethernet frame by using the CRC of the second binary sequence as an initial value of a CRC register of the fifth CRC calculation circuit.

5. The method according to claim 1, wherein the first CRC calculation circuit comprises a first data exclusive OR calculation circuit, and the first data exclusive OR calculation circuit is expressed as:

$$\text{CRC\_D}_n = [\begin{array}{cccc} P & H*P & \ldots & H^{n-1}*P \end{array}] * \begin{bmatrix} d_{n-1} \\ d_{n-2} \\ \vdots \\ d_0 \end{bmatrix},$$

wherein $d_0$ to $d_{n-1}$ in $$\begin{bmatrix} d_{n-1} \\ d_{n-2} \\ \vdots \\ d_0 \end{bmatrix}$$

are respectively a least significant bit to a most significant bit of the binary sequence having the M bits, and a value of n is M; and $$P = \begin{bmatrix} P_{m-1} \\ \vdots \\ p_1 \\ p_0 \end{bmatrix}$$

is a generator polynomial matrix, $p_{m-1}$ to $p_0$ are CRC polynomial coefficients of the first CRC calculation circuit, m is a degree of a generator polynomial, and $$H = \begin{bmatrix} p_{m-1} & 1 & 0 & \cdots & 0 & 0 \\ p_{m-2} & 0 & 1 & & & 0 \\ p_{m-3} & & & \ddots & & 0 \\ \vdots & & & & 1 & \vdots \\ p_1 & 0 & 0 & \cdots & 0 & 1 \\ p_0 & 0 & 0 & 0 & 0 & 0 \end{bmatrix}_{m*m}$$

is a transformation matrix; and
the second CRC calculation circuit comprises a second data exclusive OR calculation circuit, and the second data exclusive OR calculation circuit is expressed as:

$$CRC\_D_n = [P \quad H*P \quad \cdots \quad H^{n-1}*P] * \begin{bmatrix} d_{n-1} \\ d_{n-2} \\ \vdots \\ d_0 \end{bmatrix},$$

wherein $d_0$ to $d_{n-1}$ in $$\begin{bmatrix} d_{n-1} \\ d_{n-2} \\ \vdots \\ d_0 \end{bmatrix}$$

are respectively a least significant bit to a most significant bit of the binary sequence having the M bits, and a value of n is N; and $$P = \begin{bmatrix} P_{m-1} \\ \vdots \\ p_1 \\ p_0 \end{bmatrix}$$

is a generator polynomial entry matrix, $p_{m-1}$ to $p_0$ are CRC polynomial coefficients of the first CRC calculation circuit, m is a degree of a generator polynomial, and $$H = \begin{bmatrix} p_{m-1} & 1 & 0 & \cdots & 0 & 0 \\ p_{m-2} & 0 & 1 & & & 0 \\ p_{m-3} & & & \ddots & & 0 \\ \vdots & & & & 1 & \vdots \\ p_1 & 0 & 0 & \cdots & 0 & 1 \\ p_0 & 0 & 0 & 0 & 0 & 0 \end{bmatrix}_{m*m}$$

is a transformation matrix.

6. A cyclic redundancy check code (CRC) calculation apparatus applied in an Ethernet network, comprising:
   a receiving circuit, configured to receive a binary sequence of a first pulse, wherein the binary sequence of the first pulse comprises a first Ethernet frame and a second Ethernet frame, the number of bits in the first Ethernet frame is M, the number of bits in the second Ethernet frame is N, M and N are positive integers, and M is unequal to N;
   a scheduling circuit, configured to distribute the first Ethernet frame received by the receiving circuit to a first CRC calculation circuit, and distribute the second Ethernet frame received by the receiving circuit to a second CRC calculation circuit;
   the first CRC calculation circuit, configured to determine whether an error occurs in the first Ethernet frame by calculating CRC of the first Ethernet frame distributed by the scheduling circuit, wherein the first CRC calculation circuit is configured to calculate CRC of a binary sequence having M bits; and
   the second CRC calculation circuit, configured to determine whether an error occurs in the second Ethernet frame by calculating CRC of the second Ethernet frame distributed by the scheduling circuit, wherein the second CRC calculation circuit is configured to calculate CRC of a binary sequence having N bits.

7. The apparatus according to claim 6, wherein the apparatus further comprises a third CRC calculation circuit, the binary sequence of the first pulse further comprises a third Ethernet frame, and the number of bits in the third Ethernet frame is X;
   the scheduling circuit is further configured to:
   generate a first binary sequence according to the third Ethernet frame received by the receiving circuit, wherein the number of bits in the first binary sequence is Y, a value of high order X bits in the first binary sequence is equal to a value of the bits in the third Ethernet frame, a value of low order C bits in the first binary sequence is equal to 0, Y=X+C, and Y, X, and C are positive integers; and
   distribute the first binary sequence to the third CRC calculation circuit; and
   the third CRC calculation circuit is configured to calculate CRC of the first binary sequence distributed by the scheduling circuit.

8. The apparatus according to claim 6, wherein the apparatus further comprises a fourth CRC calculation circuit, the binary sequence of the first pulse further comprises high order A bits in a fourth Ethernet frame, and the number of bits in the fourth Ethernet frame is A+B;

the scheduling circuit is further configured to:
generate a second binary sequence according to the high order A bits in the fourth Ethernet frame, wherein the number of bits in the second binary sequence is G, a value of high order A bits in the second binary sequence is equal to a value of the high order A bits in the fourth Ethernet frame, a value of low order H bits in the second binary sequence is equal to 0, G=A+H, A, B, and G are positive integers, H is an integer greater than or equal to 0, and B is less than or equal to G; and
distribute the second binary sequence to the fourth CRC calculation circuit;
the fourth CRC calculation circuit is configured to calculate CRC of the second binary sequence to initialize a value of a CRC register of the fourth CRC calculation circuit;
the receiving circuit is further configured to receive a binary sequence of a second pulse, wherein the second pulse is a pulse following the first pulse, and the binary sequence of the second pulse comprises low order B bits in the fourth Ethernet frame;
the scheduling circuit is further configured to distribute the low order B bits in the fourth Ethernet frame to the fourth CRC calculation circuit; and
the fourth CRC calculation circuit is further configured to calculate CRC of the low order B bits in the fourth Ethernet frame by using the CRC of the second binary sequence as an initial value of the CRC register of the fourth CRC calculation circuit.

9. The apparatus according to claim 6, wherein the apparatus further comprises a fourth CRC calculation circuit and a fifth CRC calculation circuit, the binary sequence of the first pulse further comprises high order A bits in a fourth Ethernet frame, and the number of bits in the fourth Ethernet frame is A+B;
the scheduling circuit is further configured to:
generate a second binary sequence according to the high order A bits in the fourth Ethernet frame, wherein the number of bits in the second binary sequence is G, a value of high order A bits in the second binary sequence is equal to a value of the high order A bits in the fourth Ethernet frame, a value of low order H bits in the second binary sequence is equal to 0, G=A+H, A, B, and G are positive integers, and H is an integer greater than or equal to 0; and
distribute the second binary sequence to the fourth CRC calculation circuit;
the fourth CRC calculation circuit is configured to calculate CRC of the second binary sequence according to the second binary sequence distributed by the scheduling circuit;
the receiving circuit is further configured to receive a binary sequence of a second pulse, wherein the second pulse is a pulse following the first pulse, and the binary sequence of the second pulse comprises low order B bits in the fourth Ethernet frame;
the scheduling circuit is further configured to distribute the low order B bits in the fourth Ethernet frame to the fifth CRC calculation circuit; and
the fifth CRC calculation circuit is configured to calculate CRC of the low order B bits in the fourth Ethernet frame by using the CRC of the second binary sequence as an initial value of a CRC register of the fifth CRC calculation circuit.

10. The apparatus according to claim 6, wherein the first CRC calculation circuit comprises a first data exclusive OR calculation circuit, and the first data exclusive OR calculation circuit is expressed as:

$$CRC\_D_n = [\, P \quad H*P \quad \ldots \quad H^{n-1}*P\,] * \begin{bmatrix} d_{n-1} \\ d_{n-2} \\ \vdots \\ d_0 \end{bmatrix},$$

wherein $d_0$ to $d_{n-1}$ in $$\begin{bmatrix} d_{n-1} \\ d_{n-2} \\ \vdots \\ d_0 \end{bmatrix}$$

are respectively a least significant bit to a most significant bit of the binary sequence having the M bits, and a value of n is M; and $$P = \begin{bmatrix} p_{m-1} \\ \vdots \\ p_1 \\ p_0 \end{bmatrix}$$

is a generator polynomial matrix, $p_{m-1}$ to $p_0$ are CRC polynomial coefficients of the first CRC calculation circuit, m is a degree of a generator polynomial, and $$H = \begin{bmatrix} p_{m-1} & 1 & 0 & \ldots & 0 & 0 \\ p_{m-2} & 0 & 1 & & & 0 \\ p_{m-3} & & & \ddots & & 0 \\ \vdots & & & & 1 & \vdots \\ p_1 & 0 & 0 & \ldots & 0 & 1 \\ p_0 & 0 & 0 & 0 & 0 & 0 \end{bmatrix}_{m*m}$$

is a transformation matrix; and
the second CRC calculation circuit comprises a second data exclusive OR calculation circuit, and the second data exclusive OR calculation circuit is expressed as:

$$CRC\_D_n = [\, P \quad H*P \quad \ldots \quad H^{n-1}*P\,] * \begin{bmatrix} d_{n-1} \\ d_{n-2} \\ \vdots \\ d_0 \end{bmatrix},$$

wherein $d_0$ to $d_{n-1}$ in $$\begin{bmatrix} d_{n-1} \\ d_{n-2} \\ \vdots \\ d_0 \end{bmatrix}$$

are respectively a least significant bit to a most significant bit of the binary sequence having the M bits, and a value of n is N; and $$P = \begin{bmatrix} P_{m-1} \\ \vdots \\ p_1 \\ p_0 \end{bmatrix}$$

is a generator polynomial entry matrix, $p_{m-1}$ to $p_0$ are CRC polynomial coefficients of the first CRC calculation circuit, m is a degree of a generator polynomial, and $$H = \begin{bmatrix} p_{m-1} & 1 & 0 & \ldots & 0 & 0 \\ p_{m-2} & 0 & 1 & & & 0 \\ p_{m-3} & & & \ddots & & 0 \\ \vdots & & & & 1 & \vdots \\ p_1 & 0 & 0 & \ldots & 0 & 1 \\ p_0 & 0 & 0 & 0 & 0 & 0 \end{bmatrix}_{m*m}$$

is a transformation matrix.

\* \* \* \* \*